United States Patent [19]

Nakano et al.

[11] Patent Number: 5,717,393
[45] Date of Patent: Feb. 10, 1998

[54] APPARATUS FOR DATA COMPRESSION AND DATA DECOMPRESSION

[75] Inventors: Yasuhiko Nakano; Kimitaka Murashita; Yoshiyuki Okada; Shigeru Yoshida; Masanaga Tokuyo, all of Kawasaki, Japan

[73] Assignee: Fujitsu Limited, Kawasaki, Japan

[21] Appl. No.: 684,045

[22] Filed: Jul. 19, 1996

[30] Foreign Application Priority Data

Feb. 8, 1996 [JP] Japan ................ 8-022245

[51] Int. Cl.$^6$ ................ H03M 7/30
[52] U.S. Cl. ................ 341/50; 341/51; 341/65; 341/106; 341/107
[58] Field of Search ................ 341/50, 51, 61, 341/65, 67, 87, 106, 107

[56] References Cited

U.S. PATENT DOCUMENTS

| | | | |
|---|---|---|---|
| 4,730,348 | 3/1988 | MacCrisken | 375/122 |
| 4,796,003 | 1/1989 | Bentley et al. | 341/95 |
| 5,239,298 | 8/1993 | Wei | 341/51 |
| 5,379,036 | 1/1995 | Storer | 341/51 |
| 5,384,568 | 1/1995 | Grinberg et al. | 341/51 |
| 5,528,628 | 6/1996 | Park et al. | 375/240 |

OTHER PUBLICATIONS

Peter Fenwick, "Block Sorting Text Compression," Australian Computer Science Communications vol. 18, No. 1, p. 193–202, (Jan. 31, 1996).

M. Burrows, et al., *A Block–Sorting Lossless Data Compression Algorithm*, SRC Research Report, Digital Systems Research Cetner, California, May 10, 1995.

*Primary Examiner*—Jeffrey A. Gaffin
*Assistant Examiner*—Jason L. W. Kost
*Attorney, Agent, or Firm*—Staas & Halsey

[57] ABSTRACT

The present invention provides a plurality of code tables such as a high-usage code table and a low-usage code table in an entropy coding unit, and transforms a block-sorted last character string from a block-sorting transforming unit into an MTF code string in an MTF transforming unit. The entropy coding unit switches the code tables at a discontinuous part of the MTF code string to perform entropy coding. In addition, the present invention stores reference lists, whose number is equal to the number of kinds of used characters, in a reference list memory. The MTF transforming unit selects a reference list corresponding to a first character of the block-sorted character string to perform an MTF transformation.

24 Claims, 33 Drawing Sheets

FIG. 3A PRIOR ART

| S~ | a | a | b | r | a | c |
|---|---|---|---|---|---|---|
|  | a | b | r | a | c | a |
|  | b | r | a | c | a | a |
|  | r | a | c | a | a | b |
|  | a | c | a | a | b | r |
|  | c | a | a | b | r | a |

FIG. 3B PRIOR ART

LEXICOGRAPHIC SORTING

| S | | | | | |
|---|---|---|---|---|---|
| a | a | b | r | a | c | ← I = 0
| a | b | r | a | c | a |
| a | c | a | a | b | r |
| b | r | a | c | a | a |
| c | a | a | b | r | a |
| r | a | c | a | a | b | ~L

FIG. 9

| | | |
|---|---|---|
| L1 | a*************c | ⎤ |
| L2 | a*************c | ⎥ GROUP A |
| L3 | a*************c | ⎥ |
| L4 | a*************c | ⎦ |
| | | ⎫ DISCONTINUOUS BOUNDARY |
| L5 | b*************f | ⎤ |
| L6 | b*************f | ⎥ GROUP B |
| L7 | b*************f | ⎥ |
| L8 | b*************f | ⎦ |
| | | ⎫ DISCONTINUOUS BOUNDARY |
| L9 | c*************b | ⎤ |
| L10 | c*************b | ⎥ GROUP C |
| L11 | c*************b | ⎥ |
| L12 | c*************b | ⎦ |

FIG. 12A

| | ROTATED STRING | OUTPUT | | REFERENCE LIST |
|---|---|---|---|---|
| | he_ | ... | t 19 | [tabcdefghijklmnopqrsuvwxyz] |
| | he_ | ... | s 19 | [stabcdefghijklmnopqruvwxyz] |
| | he_ | ... | s 0 | [stabcdefghijklmnopqruvwxyz] |
| | heory | ... | t 1 | [tsabcdefghijklmnopqruvwxyz] |
| GROUP A | heory | ... | t 0 | [tsabcdefghijklmnopqruvwxyz] |
| | heory | ... | t 0 | [tsabcdefghijklmnopqruvwxyz] |
| | hey | ... | t 0 | [tsabcdefghijklmnopqruvwxyz] |
| | he_ | ... | s 1 | [stabcdefghijklmnopqruvwxyz] |
| | hey | ... | t 1 | [tsabcdefghijklmnopqruvwxyz] |
| | hey | ... | t 0 | [tsabcdefghijklmnopqruvwxyz] |

---------------------------------- DISCONTINUOUS BOUNDARY ----------------------------------

| | ROTATED STRING | OUTPUT | | REFERENCE LIST |
|---|---|---|---|---|
| | rt | ... | conser 19 | [rtsabcdefghijklmnopquvwxyz] |
| | rt | ... | ale 7 | [ertsabcdfghijklmnopquvwxyz] |
| | rt | ... | a 4 | [aertsbcdfghijklmnopquvwxyz] |
| | rt | ... | ale 1 | [eartsbcdfghijklmnopquvwxyz] |
| GROUP B | rt | ... | ale 0 | [eartsbcdfghijklmnopquvwxyz] |
| | rt | ... | conser 2 | [reatsbcdfghijklmnopquvwxyz] |
| | rt | ... | ale 1 | [eartsbcdfghijklmnopquvwxyz] |
| | rt | ... | conser 1 | [reatsbcdfghijklmnopquvwxyz] |
| | rt | ... | ale 1 | [reatsbcdfghijklmnopquvwxyz] |
| | rt | ... | ale 1 | [reatsbcdfghijklmnopquvwxyz] |

---------------------------------- DISCONTINUOUS BOUNDARY ----------------------------------

| | ROTATED STRING | OUTPUT | | REFERENCE LIST |
|---|---|---|---|---|
| GROUP C | ield | ... | y 24 | [yreatsbcdfghijklmnopquvwxz] |
| | ier | ... | p 19 | [yreatsbcdfghijklmnopquvwxz] |

FIG. 12B

| NUMBER | 0000000000111111111122222<br>0123456789012345678901234 5 |
|---|---|
| INITIAL VALUE OF REFERENCE LIST | [abcdefghijklmnopqrstuvwxyz] |

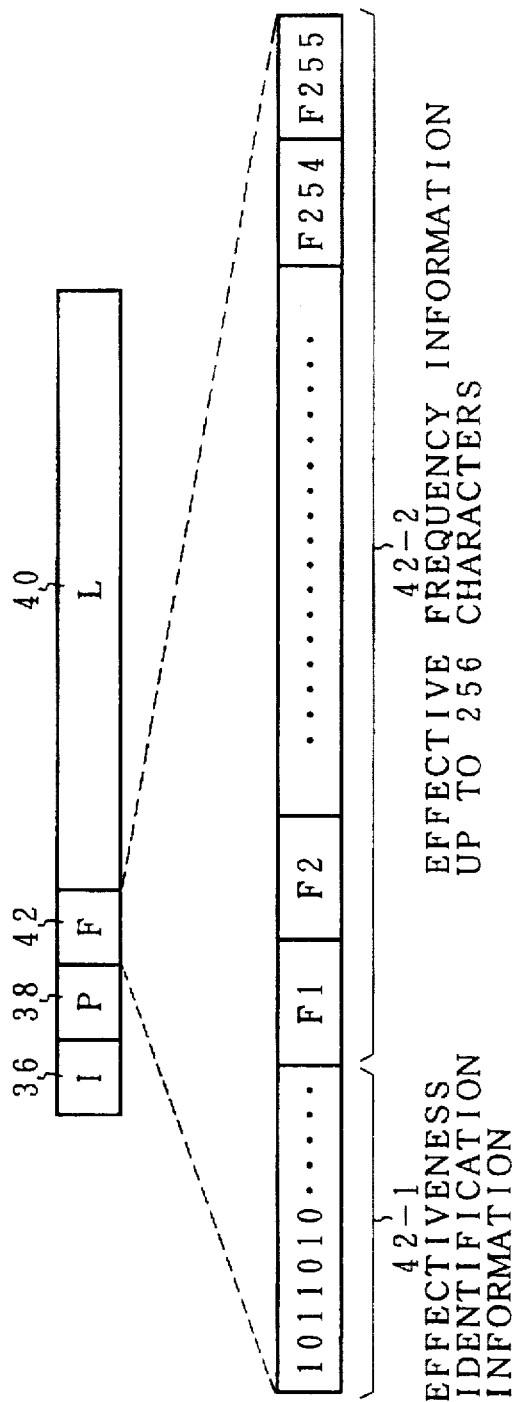
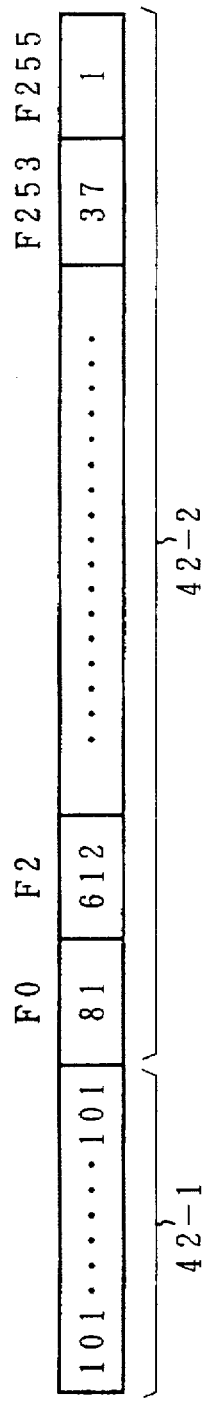

APPARATUS FOR DATA COMPRESSION AND DATA DECOMPRESSION

BACKGROUND OF THE INVENTION

1. Field of the Invention

The present invention relates to an apparatus for data compression and decompression which encodes and compresses information composed of a code string such as characters for transmission or storage, and more particularly, to an apparatus for data compression and decompression in which a block-sorting algorithm is applied.

2. Description of the Related Art

A method is commonly used, the method that, in case information composed of a code string such as characters is transmitted or stored and data volume is large, it is transmitted or stored after compression of the data string for effective use of communication lines and memory capacity, and it is decompressed again when it is used. Although compression and decompression of a data string like this can be applied to not only a character code but also general data, hereinafter one word of data is called as a character, following the designation used in information theory and so on.

Heretofore, Ziv-Lempel coding (hereinafter this is called as ZL coding) is well-known as an efficient compression algorithm for character codes (for example, Seiji Munakata, A Ziv-Lempel data compression algorithm, Information Processing, Vol. 26, 1985, No. 1, pp. 2–6). In addition, as another compression algorithm, an arithmetic coding algorithm is also well-known (for example, "Text Compression" by Prentice Hall, T. C. Bell, J. G. Clearry, and I. H. Witten). Since these two algorithms are well studied, there are many variations. The ZL coding is high-speed due to a comparatively simple algorithm, and hence, implementation of this algorithm in personal computers and the like can be done easily. Compression software for personal computers in the market mostly uses this algorithm. However, a compression rate of this algorithm is not sufficient. On the other hand, the arithmetic coding is the algorithm precisely calculating the occurrence probabilities of characters and coding them, and hence, its compression rate is near to the theoretical value. However, it needs volumes of calculation. Therefore, it has a demerit that its calculation speed is too late to be used in personal computers and so on. In consequence, it is a current tendency that the ZL coding is used for higher speed and the arithmetic coding algorithm for higher compression performance.

On the basis of this background, a block-sorting algorithm was announced in 1994 (M. Burrows and D. J. Wheeler, A Block-sorting Lossless Data Compression Algorithm, DEC SRC Lab., May 10, 1994) as a new compression algorithm with which compatibility of the processing speed and compression rate was aimed. The block-sorting algorithm compresses character codes by aiming at the relationship between a character string and connecting relations of characters. Its processing procedure, as shown in FIG. 1, is divided into three units, a block-sorting transforming unit 110, a move-to-front transforming unit (hereafter, this is referred to an MTF transforming unit) 112, and an entropy coding unit with a code table 116.

Concept of the block-sorting processing is as shown in FIG. 2. In FIG. 2, a case is exemplified, the case that a character string "aabrac" is inputted. First, a data stream of a character string is divided into, for example, six-character blocks and inputted to the block-sorting transforming unit 110 as a character string "aabrac". The block-sorting transforming unit 110 as the first stage rotates the character string within its block, and further sorts the strings lexicographically. The MTF transforming unit 112 inputs a last character string L in a sorted order, and transforms this character string L into an intermediate code "213103" by performing MTF processing, which is known as the processing for moving a character to the head of a string, as the second stage. Finally, using the code table 116, the entropy coding unit 114 applies to the intermediate code "213103" the entropy coding such as variable length coding. Further details will be described below.

Block-sorting

Let an input string S be "aabrac", and the block-sorting transforming unit 110 shown in FIG. 1, as shown in FIG. 3A, generates a two-dimensional character matrix that is composed of character strings each of which comes from the input character string S rotated counter-clockwise. Next, as shown in FIG. 3B, the unit 110 sorts the character strings in the two-dimensional character matrix lexicographically. In the sorted two-dimensional character matrix, the input character string S, "aabrac" is located at row 0 out of row 0 to row 9. This position is expressed as I=0. Further, the unit 110 outputs to the MTF transforming unit 112 a pair of the last character string L in the sorted two-dimensional character matrix, that is, a block-sorted character string L, "caraab" and the position in the matrix I=0 as an intermediate code, (I, L)=(0, "caraab"). Finally, the entropy coding unit 114 applies the entropy coding to the code. In decompression, it is necessary for the intermediate code, (I, L)=(0, "caraab") to be transferred from the MTF transforming unit, and to be decompressed from the intermediate code to the original character string S. The following is a procedure of decompression from the block-sorted character string L, transformed into the intermediate code (I, L), to the original character string S. Suppose the block-sorted character string L, "caraab" is obtained through an MTF inverse transformation, arrangement of the two-dimensional character matrix having the string L as the last character string is obtained as shown in FIG. 4A. Here, a symbol * shows an undecided character. Since the first character column P in the sorted two-dimensional character matrix coincides with the last character column (string) L that is sorted lexicographically, P="aaabcr" becomes clear. If the first character column P is arranged into a two-dimensional character matrix, the matrix becomes as shown in FIG. 4B. As shown in FIG. 4B, after obtaining the last character column L and first character column P, the characters each of which the symbol * is marked on are decompressed. Then, as shown in FIG. 5, consider the decompressed two-dimensional character matrix M having the first character column P, and a two-dimensional character matrix M1 that is the two-dimensional character matrix rotated clockwise one-time. Since the two-dimensional character matrix M is sorted lexicographically, characters starting with their second character are kept to be sorted lexicographically. That is, in the two-dimensional character matrix M1, the order of the strings whose first characters are identical is kept in the original two-dimensional character matrix M. Concretely, in the two-dimensional character matrix M1, the second, forth, and fifth character rows (strings) which have the same first character, "a" are kept also to be the first, second, and third character rows in the original two-dimensional character matrix M sorted lexicographically. Consequently, the correspondence relation shown with arrows in FIG. 5 is formed between the first character column in the two-dimensional character matrix M and the first character column in the two-dimensional character matrix M1 obtained by rotating the two-dimensional character matrix M clockwise once. This correspondence relation gives the correspondence relation between the first character column P and last character column L in the two-dimensional character matrix to be decompressed, as arrows in FIG. 4B. In FIG. 4B, it becomes clear that the character string S to be decompressed is the string "a*c", the first row of the two-dimensional character matrix, because I=0. Next, the fifth character preceding the last character, "c" is the first character of the character string after sorting of strings which are obtained by rotating the decompressed character string S, "a*c". Therefore, from the correspondence relation shown in FIG. 4B, the first string is rotated and sorted. Then, as shown in FIG. 6A, the last character, "c" of the first character row is located at the first character, "c" of the sixth character row shown with the arrow 104. Further, the last character, "a" shown with the arrow 106 against the first character, "c" of the sixth character row may be located before the last character, "c" of the second character row. Therefore, the string S becomes clear to be "a*ac". Next, as shown in FIG. 6B, the character before the fifth decompressed character, "a" becomes clear to be the character, "r" from the relation of the arrows 108 and 110, and hence, the decompressed character string S becomes clear to be "arac". Further, as shown in FIG. 6C, the character before the forth decompressed character, "r" becomes clear to be the character, "b" from the relation between the arrows 112 and 114, and hence, the decompressed string becomes clear to be "a*brac". Finally, as shown in FIG. D, the character before the second decompressed character, "b" also becomes clear to be the character, "a" from the relation between the arrows 116 and 118. Therefore, the decompressed string S becomes clear to be "aabrac", and hence, all of the input string can be decompressed.

MTF Transformation

FIG. 7 shows processing in the MTF transforming unit 112 shown in FIG. 1. Regarding the block-sorted character string (I, L) outputted from the block-sorting transforming unit, the MTF transforming unit 112 applies no transformation to the character row position I, and applies MTF transformation only to the last character string (column) L. Here, it is assumed for following explanation that the last character string L is "caraab". When performing the MTF transformation to the last character string L, a reference list 120 is prepared. The reference list is called as Y. "abcr" is used as the initial value of the reference list Y. When the first character, "c" of the last character string L inputted as an input list 122 is inputted, the MTF transforming unit 112 refers to the list Y. Since the character, "c" is located at the second position from the head of the list, the unit 112 outputs a code, "2". After code transformation, the character, "c" used for the transformation is moved to the head of the list Y, and hence, Y is updated to be "cabr". Subsequently, residual characters, "a", "r", "a", "a", and "b" are inputted in turn, and the above process is repeated to update the list after the transformation to the code showing the position from the head of the list Y. Consequently, with the MTF transformation, an MTF code string, "213103" is obtained as an intermediate code.

FIG. 8 shows an MTF inverse transformation to restore the MTF-transformed code string, "213103" in FIG. 7 to the original character string L, "caraab". Also using "abcr" as the reference list Y, an MTF inverse transforming unit 130 refers to the list Y when the first code, "2" of the code string, "213103" inputted as an input MTF code 128 is inputted. Therefore, the unit 130 decompresses the character, "c" located at the second position from the head of the list. After decompression, the character, "c" used for the transformation is moved to the head of the list Y, and hence, Y is updated to be "cabr". Subsequently, residual codes, "1", "3", "1", "0", and "3" are inputted in turn, and the above process is repeated to update the list after the decompression to the character corresponding to the code showing the position from the head of the list Y. Consequently, with the MTF inverse transformation, the last character string L, "caraab" is decompressed.

Entropy Coding

The entropy coding unit 114 shown in FIG. 1 applies entropy coding to a MTF-transformed code string. As a concrete method, simple static-Huffman coding can be used. Since a code string after the MTF transformation is biased to around zero, variable length coding expressing positions around zero in short codes may be performed. In order to increase efficiency in correspondence to a property of a data string, dynamic-Huffman coding is good except processing speed.

Since the block-sorting algorithm like this can grasp context (relation between characters) by rotating a character string and sorting strings and can encode the character strings using higher-order relations of character strings, a high compression rate can be obtained. In addition, the object to be finally encoded in the block-sorting algorithm is the sorted last characters in one dimension. And, locally, parts having similar contexts gather and the codes after MTF transformation are biased to around zero, and hence, a high compression rate can be obtained. However, globally looking at the sorted last character string, there are many discontinuous parts, and hence, properties of contexts are not sufficiently utilized. For example, FIG. 9 shows a block-sorted last character string, L1 to L12, and locally, parts such as groups A, B, and C each having similar context gather respectively to obtain a high compression rate. However, globally, a discontinuous part occurs at each boundary of groups A, B, and C, and hence, if the MTF transformation is performed to this, MTF codes greatly decenter from around zero at the discontinuous parts. Therefore, a long bit length becomes necessary for a code, and hence, this causes decrease of the compressed rate. In order to offset these discontinuous parts, it is necessary to make local parts larger. Therefore, a block size must be more than some megabytes, and hence, a problem is that processing efficiency may decrease due to an excessively large block size.

SUMMARY OF THE INVENTION

The present invention provides an apparatus for data compression and data decompression, the apparatus suppressing decrease of the coding efficiency at minimum at the discontinuous parts of the block-sorted character string, and increasing the compression rate without extending the block size.

First, the present invention is characterized in that, in order to suppress decrease of the coding efficiency at discontinuous parts of the block-sorted character string, plurality of code tables such as a high-usage code table and a low-usage code table are provided as code tables used for the entropy coding, the code tables being switched for entropy coding when the discontinuous parts are detected. Namely, the present invention comprises the block-sorting transforming unit, MTF transforming unit, and entropy coding unit, the entropy coding unit having plurality of code tables. The block-sorting transforming unit generates a new two-dimensional character matrix with rotating a character string in a block by the number of times equal to the number of characters in the block, the block which is obtained with dividing input data of a string into predetermined size of blocks. Further, the unit sorts the rows in the matrix lexicographically, picks up the last characters in this matrix in the sorted order, and outputs them as a block-sorted character string L. The MTF transforming unit has a reference list including all of the characters composing the block-sorted character string L, transforms each character of the block-sorted character string L from the first character in turn into a code showing a registered position on the reference list, and subsequently transforms a next character after moving the transformed character to the head of the reference list. Namely, the unit transforms the block-sorted character string into an intermediate code string showing registered positions on the reference list, and outputs the intermediate code. The entropy coding unit has a plurality of code tables corresponding to a change of an input character string, and applies entropy coding to the intermediate code inputted from the MTF transforming unit, using the plurality of code tables. In regard to switching timing of the code tables in the entropy coding unit, there are two timings. One is the first switching timing when a discontinuous part is detected with the first character of the present block-sorted character string changing from one of the previous block-sorted character string. Another is the second timing when a number of processed blocks having the same first character reaches at a predetermined number after detection of the discontinuous part. The entropy coding unit has two code tables. One is the first code table (hereinafter, this is referred to "good-mode code table") where bit lengths assigned to the high-usage characters and low-usage ones are greatly different. Another is the second code table (hereafter, this is referred to "bad-mode code table") where bit lengths assigned to the high-usage characters and low-usage ones are not so different. Further, at the first timing when a discontinuous part is detected, the good-mode code table is switched to the bad-mode code table. And, at the second timing when a number of processed blocks reaches at the predetermined number after detection of the discontinuous part, the bad-mode code table is switched to the good-mode code table. Regarding n blocks having the same first character in a block-sorted character string, the entropy coding unit changes a number of blocks from switching to the bad-mode code table after detection of a discontinuous part to switching to the good-mode code table, applies entropy coding, and calculates a total amount of codes per block. And, the unit decides the number of the switched blocks generating the minimum total amount of codes as the optimum value of the number of the processed blocks deciding the second switching timing. In this case, the entropy coding unit may decide processing for deciding the optimum value of the number of the switched blocks, while the unit transforms an input string, and may use the value to switch code tables for subsequent blocks. In addition, the entropy coding unit decides the processing for deciding the optimum value of the number of the switched blocks beforehand, while the unit transforms an input string composed of typical data, and may use the value to switch code tables for all blocks. Further, the entropy coding unit provides a plurality of good-mode code tables corresponding to combination of a plurality of characters starting with the head of a block-sorted character string. And, in case the unit switches the bad-mode code table to the good-mode code table after detecting a discontinuous part, the unit selects a good-mode code table corresponding to the combination of a plurality of characters starting with the head of a block-sorted character string.

Decompression processing of a code string transformed by this type of apparatus for data compression is inverse operation to compression. Namely, an apparatus for data decompression according to the present invention comprises: an entropy decoding unit, having a plurality of code tables corresponding to a change of an input string, inputting an entropy-coded code string and decoding the string into an intermediate code string; an MTF inverse transforming unit restoring the transformed block-sorted character string using a reference list; and a block-sorting inverse transforming unit restoring to the original character string the block-sorted character string transformed by the MTF inverse transforming unit. In regard to a code table or code tables, this apparatus uses the same table(s) as one(s) in the apparatus for data compression.

Further, in another form of the present invention, for example, the MTF transforming unit has a plurality of reference lists to select one of the reference lists for use in MTF transformation every context, and hence, this makes it accurate to grasp context in the MTF transformation. Furthermore, since block size is shorten, decrease of transformation efficiency is suppressed at minimum even if a discontinuous part occurs. That is, this apparatus comprises the block-sorting transforming unit, MTF transforming unit functioning as an intermediate code transforming unit, and entropy coding unit. Further, among these units, the MTF transforming unit has a reference list memory unit storing a plurality of reference lists including all characters composing a block-sorted character string. In addition, a code table in the entropy coding unit is only one. The MTF transforming unit selects one of reference lists in the reference list memory unit, applies MTF transformation to the block-sorted character string so as to transform it into an intermediate code string showing registered positions on the reference list, and outputs the code string to the entropy coding unit. The entropy coding unit has a code table corresponding to change of an input character string, inputs identification information on the used reference list and the intermediate code string from the MTF transforming unit, and applies entropy coding. The MTF transforming unit selects a reference list in the reference list memory unit, the reference list corresponding to the first character of the block-sorted character string L or a plurality of characters starting with the first character. Instead of the MTF transforming unit that applies transformation to the next character after moving the character, which is already transformed into a code showing a registered position on a reference list, to the head of the list, this apparatus may include a transposing unit transforming a next character after moving the character transformed to a code showing a registered position on a reference list to a position preceding by one character on the reference list. The MTF transforming unit continues to use for subsequent blocks the reference list that is selected and updated in transformation of the first block. Namely, the reference list is not initialized every block, but the reference list that is updated sequentially in MTF transformation of the previous block is continuously used until a discontinuous part occurs.

An apparatus for data decompression comprises an entropy decoding unit, an MTF inverse transforming unit, and a block-sorting inverse transforming unit. Further, the MTF inverse transforming unit has a reference list memory unit like one in the MTF transforming unit, selects a reference list for use from the decompressed identification information on the reference list, and applies an MTF inverse transformation. Operations except above ones are the same as those of the apparatus for data compression.

The above and other objects, features, and advantages of the present invention will become more apparent from the following detailed description with reference to the drawings.

BRIEF DESCRIPTION OF THE DRAWINGS

FIGS. 3A and 3B each are an explanatory representation of generation of rotated strings and lexicographical sorting in block-sorting;

FIG. 9 is an explanatory representation showing discontinuous parts of a block-sorted last character string;

FIGS. 12A and 12B are explanatory representations of rotated character strings with block-sorting, MTF outputs, and reference lists, English text being exemplified;

FIGS. 25A and 25B each are an explanatory representation of a format of an MTF transformation code transmitting information of use or no use as well as usage frequency of reference lists;

DETAILED DESCRIPTION OF THE PREFERRED EMBODIMENT

Figure 10:
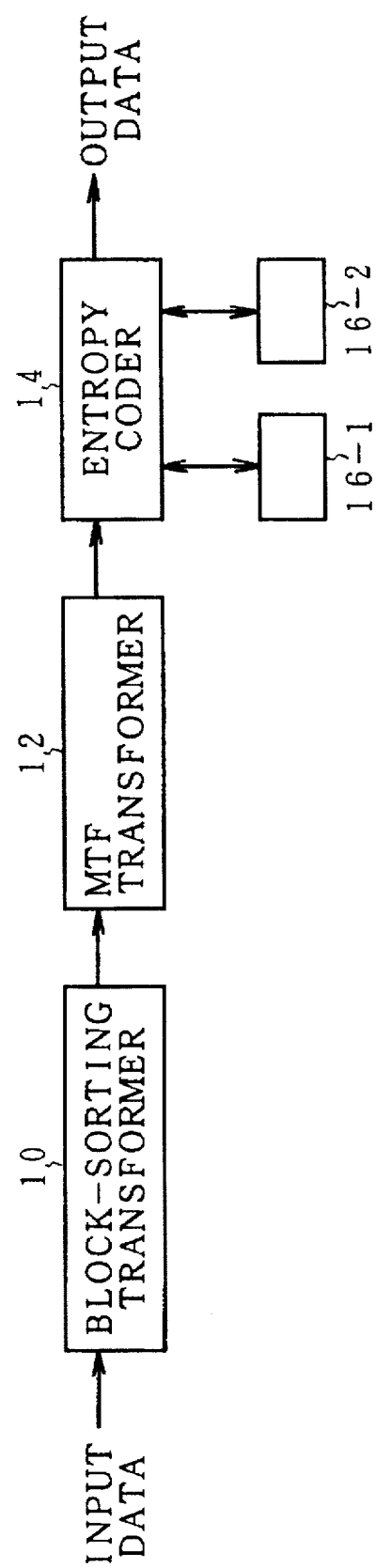
FIG. 10 is a block diagram of an apparatus for data compression according to the present invention, the apparatus which applies entropy coding with a plurality of code tables.

FIG. 10 is a block diagram of an implementation form of an apparatus for data compression according to the present invention, the apparatus being characterized in using a plurality of code tables for entropy coding. An apparatus for data compression comprises a block-sorting transforming unit 10, an MTF (Move-To-Front) transforming unit 12, and an entropy coding unit 14. The entropy coding unit 14, in this implementation form, is provided with two code tables, namely, a bad-mode code table (the second code table) 16-1 and a good-mode code table (the first code table) 16-2. The block-sorting transforming unit 10 applies block-sorting transformation every block, which is generated by dividing an input data of a character string into predetermined size of blocks such as 64-kilobyte blocks. Namely, the unit generates a two-dimensional character matrix with rotating a character string in a block by the number of times equal to the number of characters in the block, elements of which is sorted lexicographically. After that, the unit picks last characters in the sorted two-dimensional character matrix up in a sorted order to generate a block-sorted character string L. Then, the unit combines the string L with a number I showing a row number of the block-sorted character string in the sorted two-dimensional character matrix as a pair (I, L), which the unit outputs to the next stage, MTF transforming unit 12. The MTF transforming unit 12 has a reference list including all characters composing a string that is treated as input data, for example, 256 kinds of characters. Then, the unit 12 transforms the block-sorted character string L, outputted from the block-sorting transforming unit 10, from the first character in turn into codes (numbers)

showing registered positions on the reference list. After this transformation into codes showing registered positions on the reference list, the unit 12 moves the transformed character on the reference list to the head and applies a transformation to a next character. The codes, showing registered positions on the reference list and being outputted from the MTF transforming unit 12, is outputted to the entropy coding unit 14 as an intermediate code string. The entropy coding unit 14 applies entropy coding to the intermediate code string passed from the MTF transforming unit 12 with using a code table(s). As this entropy coding, for example, static Huffman coding is applied.

In the implementation form of the entropy coding unit 14 according to the present invention, the unit has two code tables, namely, a bad-mode code table 16-1 and a good-mode code table 16-2. When the unit 14 detects a discontinuous part of the sorted character string L outputted from the block-sorting transforming unit 10, the unit applies entropy coding with using the bad-mode code table 16-1 automatically selected. After entropy coding with using the bad-mode code table 16-1 through detecting the discontinuous part, the unit 14 applies entropy coding to the predetermined number of blocks. Next, the unit switches to the good-mode code table 16-2 and performs entropy coding.

Figure 11:
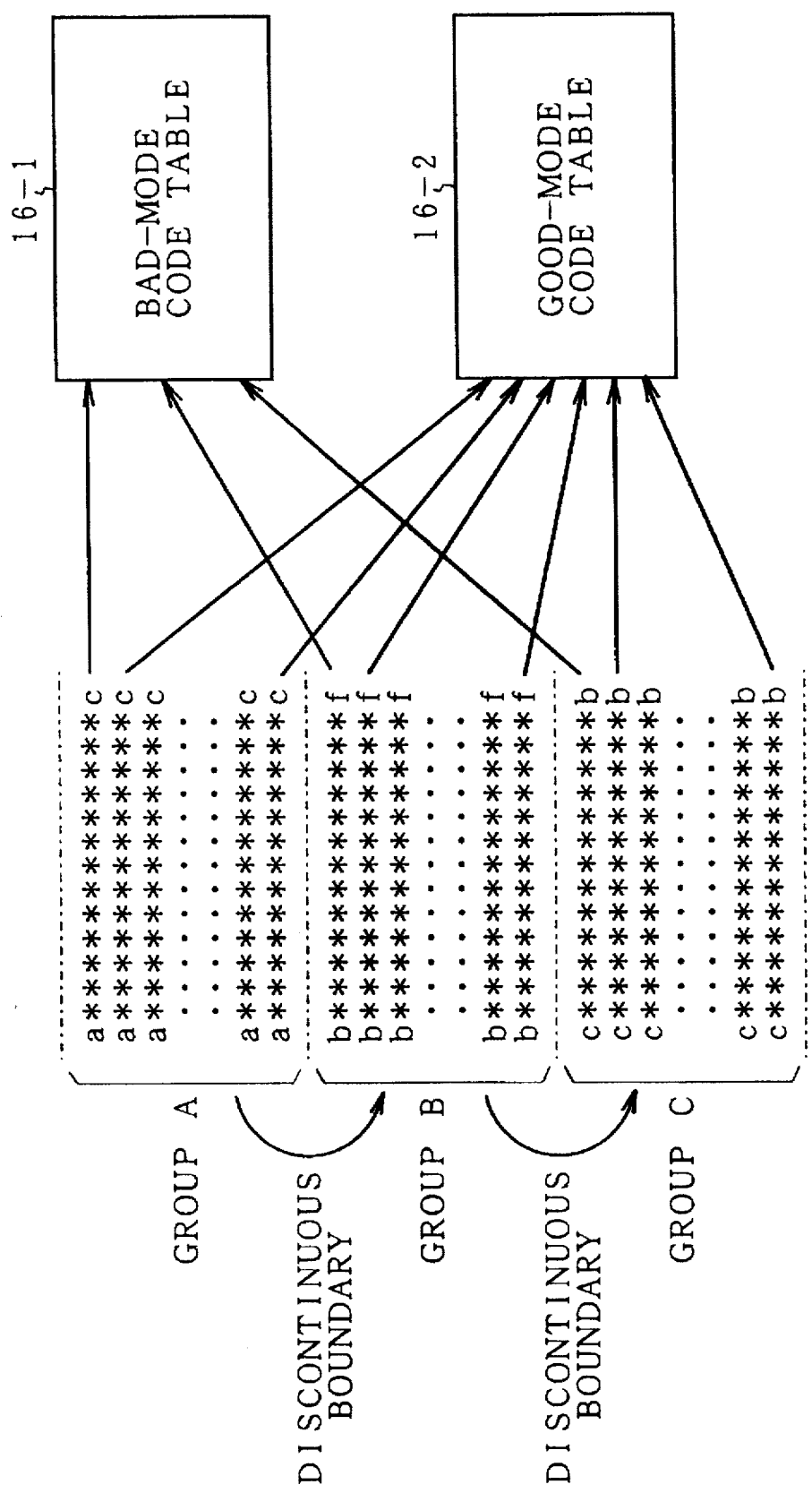
FIG. 11 is an explanatory representation showing how to select a code table and to decide a number of switched blocks, the table and number being used in FIG. 10.

FIG. 11 shows an example of a block-sorted character string L outputted from the block-sorting transforming unit 10 in the processing every block. In this case, strings, whose first and last characters are identical and which are similar each other, are generated and divided into three groups, A, B, and C. Regarding locally similar character strings of these groups A, B, and C, boundaries of each group are discontinuous parts.

FIG. 12A shows rotated character strings, an MTF output, and reference lists after block-sorting proper text, and FIG. 12B shows an initial value, "abcd . . . xyz" of the reference list, and numbers, 00-25 each showing a position of each character. In FIG. 12A, the group A is sorted on a character string starting with "he". The next group B is sorted on a character string starting with "rt". Regarding outputs after MTF transformation of these block-sorted rotated character strings, the output of the last rotated character string of the group A is 0 and the output of the first rotated character string of the group B is 19. From this result, a position where an output after MTF transformation using a reference list suddenly has a large value is a discontinuous surface. In addition, although FIG. 12A uses only 26 alphabets, actually, its output range is 0-255 since it handles eight-bit input characters. Since forecast is easily missed at this discontinuous part, it becomes impossible to assign efficient codes in the MTF transforming unit 12, that is, codes each having a short bit length because of being biased to around zero. Therefore, efficiency of code assignment decreases. For this reason, in the present invention, since the first character strings of the groups A, B, and C are located at the discontinuous parts, the entropy coding unit 14 selects the bad-mode code table 16-1 for each group to perform entropy coding. Switching from the bad-mode code table 16-1 to the good-mode code table 16-2 is performed through, for example, counting blocks processed from detection of a discontinuous part. In the implementation form shown in FIG. 11, performing entropy coding with the bad-mode code table 16-1 after detecting a discontinuous part, the unit 14 selects the good-mode code table 16-2 for a character string of the next block. Namely, if the unit applies entropy coding to a block of character string using the bad-mode code table after detecting a discontinuous part, the unit switches to the entropy coding using the good-mode code table 16-2 for the next block of character string. A threshold value TH of the number of processed blocks until switching from the bad-mode code table to the good-mode code table can be properly decided as required. On the other hand, switching from the good-mode code table 16-2 to the bad-mode code table 16-1 is automatically performed when a bad-mode transfer flag being located at the end of the maximum code length field of the good-mode code table 16-2 is assigned at the time of entropy coding.

Figure 13:
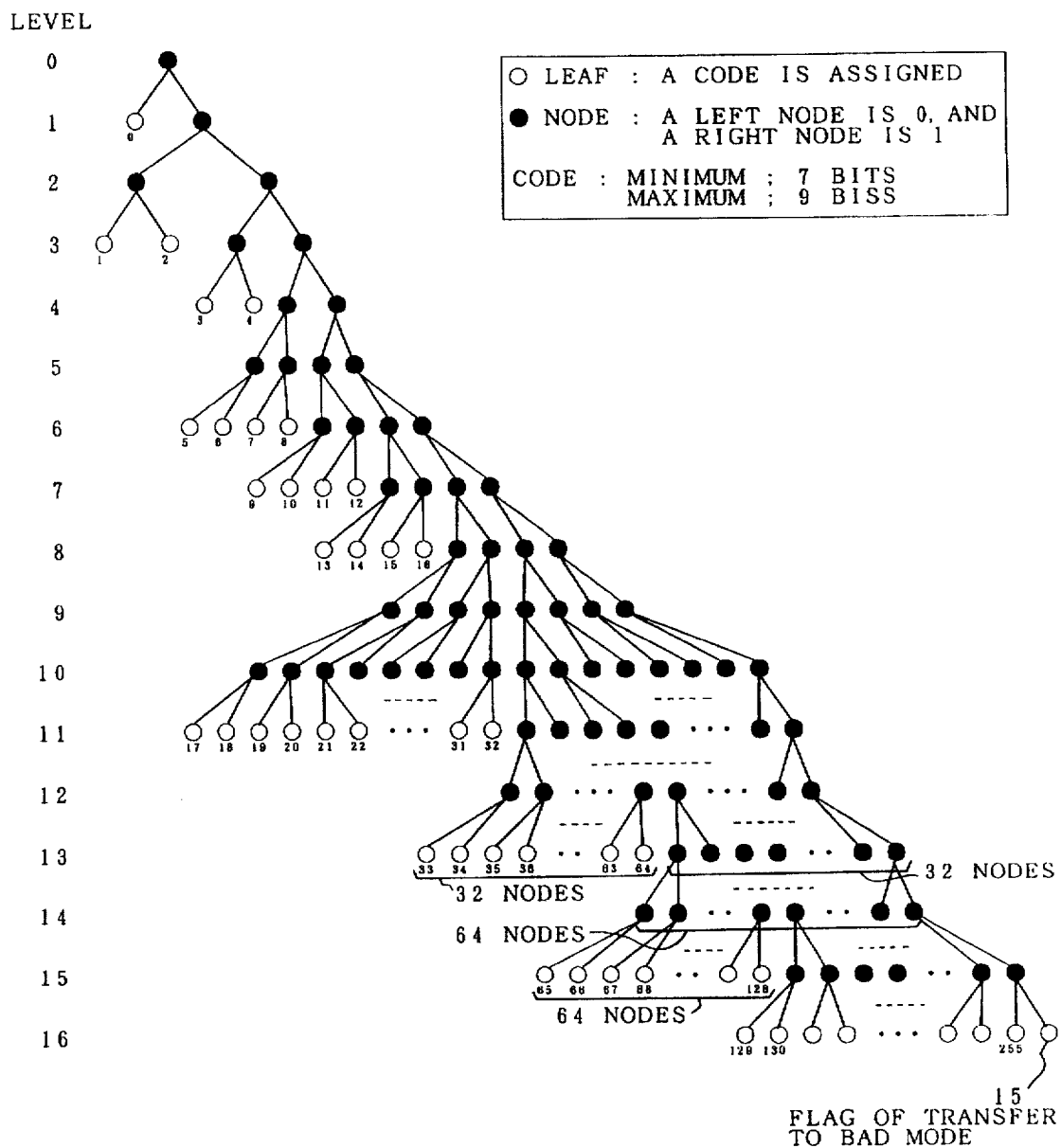
FIG. 13 is an explanatory representation of a good-mode code table shown in FIG. 11.

Here, the bad-mode code table 16-1 and good-mode code table 16-2 will be described in detail. First, the good-mode code table 16-2 performs code assignment so that a bit length assigned to a code for a high-usage character may be greatly different from a bit length assigned to a code for a low-usage character at the time of entropy coding, and hence, for example, the code table has the structure in FIG. 12. FIG. 13 shows a good-mode code table having 17 steps (level 0 to level 16) of hierarchical structure, a black point means a node, a left side node is bit 0, a right side node is bit 1, and a code is assigned, the code shown in a number enclosed in a circle which means a leaf, edge of each of branches divided at a node. Here, the minimum bit length is one bit regarding code assignment to a high-usage character located at a level zero side. In addition, bit assignment to a node may be reversed. On the other hand, regarding code assignment to a low-usage character located at a level-16 side, the maximum code is 255 in decimal notation, and hence the maximum bit length is 16 bits. Further, in another branch having the same node as the branch having the final code "255" in the level 16, a bad-mode transfer flag 15 is set. For this reason, if entropy coding is performed at a discontinuous part which is a boundary of each group in FIG. 11 when performing entropy coding with using a good-mode code table shown in FIG. 13, an intermediate code obtained by the MTF transformation receives the bad-mode transfer flag 15 on a good-mode code, and automatically transfers for use of the bad-mode code table 16-1.

Figure 14:
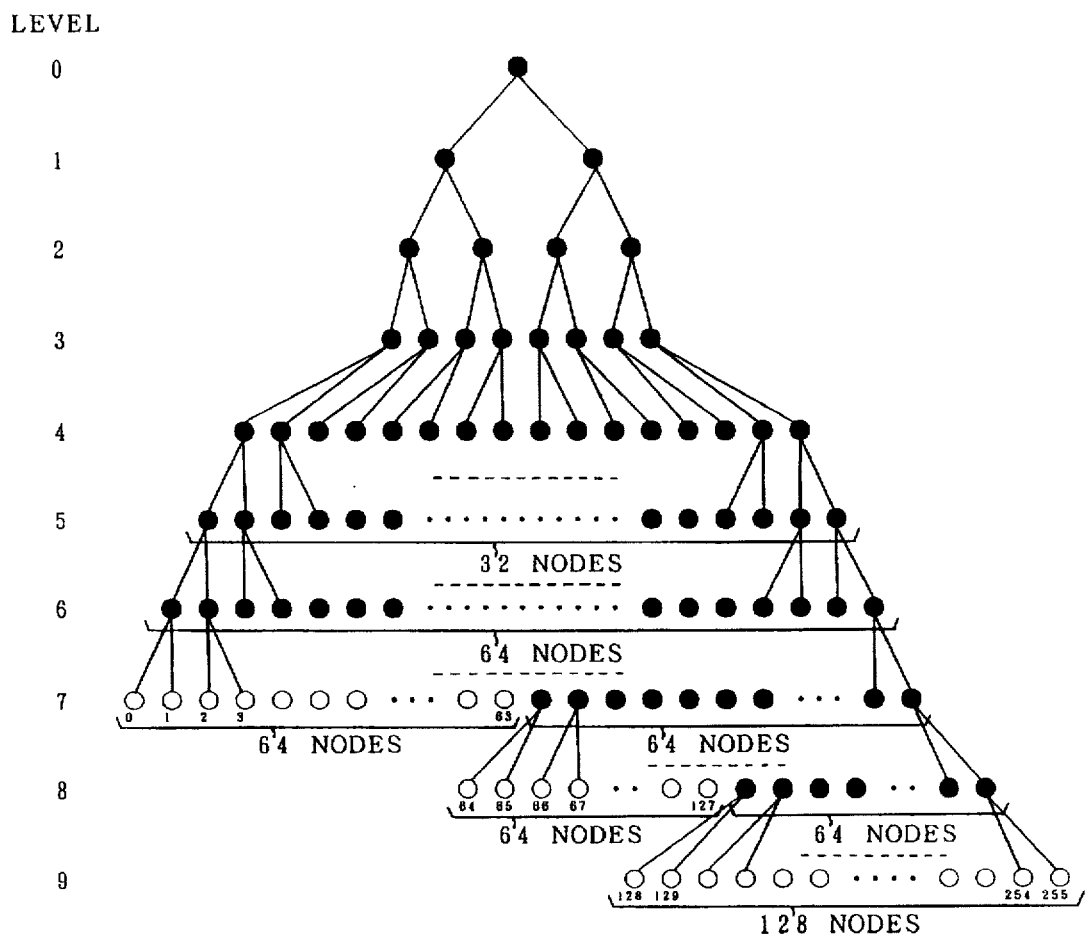
FIG. 14 is an explanatory representation of a bad-mode code table shown in FIG. 11.

The bad-mode code table 16-1, as shown in FIG. 14, performs assignment of a code whose bit length assigned to a high-usage character is not so different to a code length to a low-usage character in entropy coding. For example, the bad-mode code table in FIG. 14 performs assignment of a code whose bit length is from 7 bits at minimum at level 7 to 9 bits at maximum at level 9 regarding the hierarchical structure having levels 0 to 9. Therefore, in the bad-mode code table in FIG. 14, the bit length of a code does not become excessively long unlike the good-mode code table in FIG. 13 even if forecast is missed. However, the bit length of a code does not become short even if forecast comes true. Consequently, it is possible to suppress excessive increase of a code amount in entropy coding.

Figure 15:
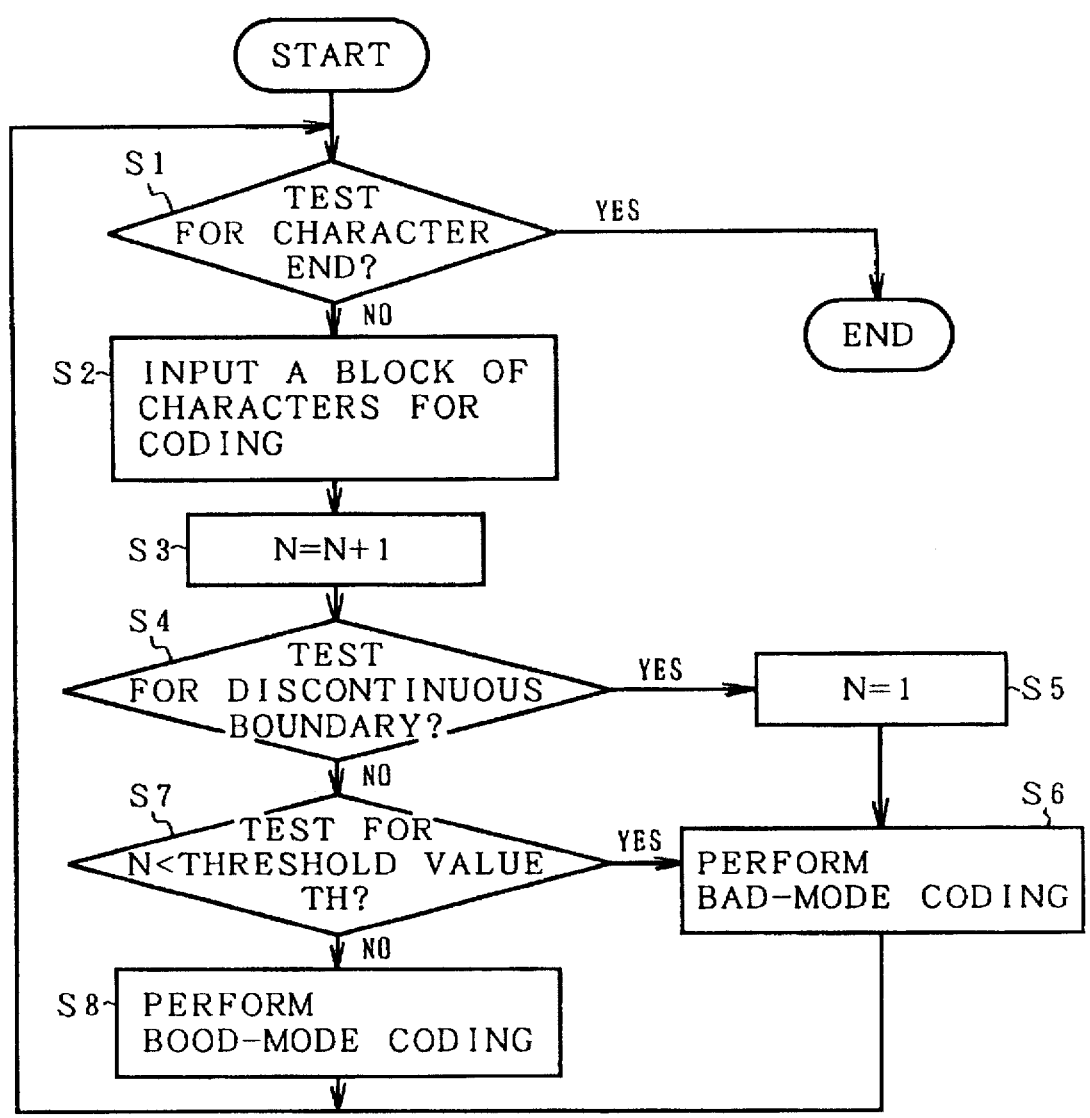
FIG. 15 is a flow chart of entropy coding processing shown in FIG. 10.

A flow chart in FIG. 15 shows coding processing of the entropy coding unit 14 in an implementation form shown in FIG. 10. First, at step S1, the unit 14 tests end of character which means end of processing of input data, a character string becoming a data stream. If its result is "no", processing advances to step S2 to input a character out of an intermediate code string outputted from the MTF transforming unit 12. Next, at step S3, the unit 14 performs an increment of a number of processed blocks, N. The number of processed blocks, N is cleared to zero at the initial state, and it is counted up every processing of a block. Next, the processing advances to step S4 to test whether a block-sorted last character string L is a discontinuous part where a group, whose elements are locally similarly each other as shown in FIG. 11, alternates with another group. Regarding this discrimination of a discontinuous part, the first block is discriminated as a discontinuous part to advance to step S5. As for a block during process, in case of entropy coding with using the good-mode code table 16-2, the bad-mode transfer flag 15 is automatically assigned like the good-mode code table shown in FIG. 13, the process advances to step S5. Of course, as detection of a discontinuous part, it may be good to test every block a first character and a last character of the block-sorted character string outputted from the block-sorting transforming unit 10, for example, to decide the block as a discontinuous part when they change to different one, and to transfer to the bad-mode in step S5. Making transfer to step S5 after positive discrimination of a discontinuous part in step S4, the unit sets the number of processed blocks, N as N=1. Further, in step S6, the unit performs entropy coding with using the bad-mode code table 16-1, what is called, bad-mode coding to a block of string, that is, the code string to which the MTF transformation is performed. Successively, the process returns to step S1, the next block of string is inputted in step S2, and the number of processed blocks, N is counted up by one in step S3. Further, the unit tests in step S4 whether the block is a discontinuous part, and if it is not the discontinuous part, the unit tests in step S7 whether the number of processed blocks, N since detection of the discontinuous part is less than a predetermined threshold value TH. In this flow chart, the threshold value is set, for example, as TH=1. Therefore, the number of processed blocks, N becomes two for the next block which the unit performs bad-mode coding due to recognition of the discontinuous part. Hence, since the number of processed blocks, N is larger than the threshold value TH, the process goes to step S8, and the unit performs entropy coding with switching to the good-mode code table 16-2, what is called, good-mode coding. This processing is repeated until detection of the end of characters in step S1. Consequently, regarding a block-sorted character string for the input character string as shown in FIG. 11, the unit applies entropy coding with using the good-mode code table to a part such as a group A, B, or C whose elements are locally identical. On the other hand, the unit applies the bad-mode coding with using the bad-mode code table 16-1 to the first block of the discontinuous part becoming a boundary of each group A, B, or C. Therefore, although the bit length of a code assigned to an intermediate code string in MTM transformation is excessively long in the coding with using the good-mode code table 16-2, this bit length is suppressed through use of the bad-mode code table 16-1. Therefore, efficient code assignment can be performed even if forecast is missed at the discontinuous part. Further, in the part where forecast comes true and same sorts of blocks gather, what is called, a continuous part, the good-mode code table 16-2 is used again. Hence, it is possible to realize efficient assignment of the code having short code length and being suitable to code assignment biased to the zero side in MTF transformation.

Figure 16:
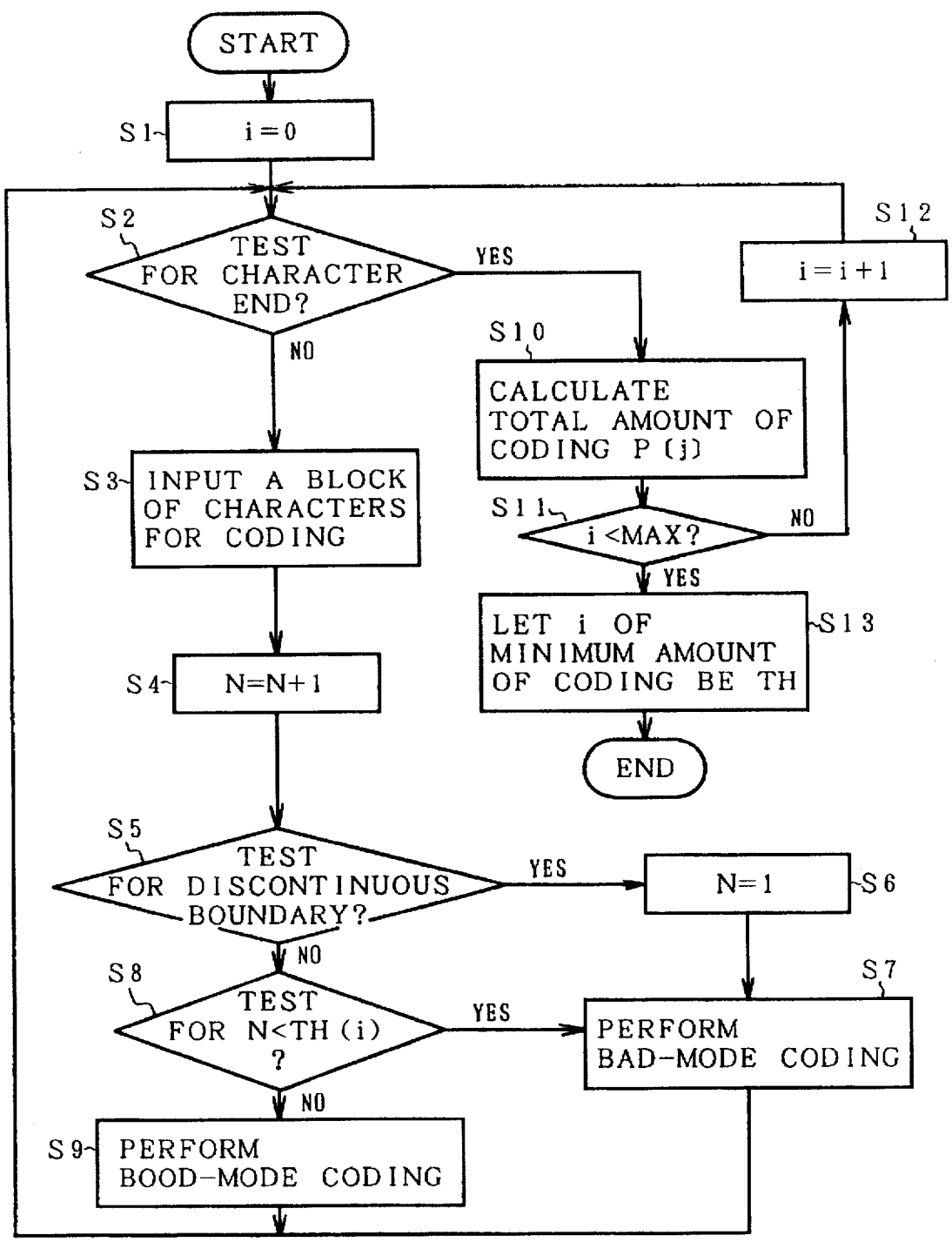
FIG. 16 is a flow chart of process for deciding a number of blocks for switching from the bad-mode code table to the good-mode code table in FIG. 15.

FIG. 16 is a flow chart for deciding the threshold value TH for switching the bad-mode coding to good-mode coding in the entropy coding shown in FIG. 15. In the entropy coding shown in FIG. 15, the threshold value TH for switching the bad-mode coding to good-mode coding is fixed to TH=1. However, switching from the bad-mode coding to good-mode coding varies depending on property of data to be processed. Therefore, it is preferable to decide the optimum threshold value TH of the number of processed blocks, N so that the amount of codes generated by entropy coding may become at minimum.

A basic algorithm of processing for deciding the threshold value TH in FIG. 16, for example, in case of a block-sorted character string in FIG. 11, is as follows. Let the block-sorted character string in the group A be L1, L2, . . . , Ln, and the unit switches a number of processed blocks, i for switching the bad-mode code table 16-1 to the good-mode code table 16-2 for each i=1, 2, 3, . . . , n to perform the entropy coding so that total amount of codes is obtained. Then, the number of processed blocks, i having the minimum amount of codes is substituted to the threshold value TH. This decision is also performed for other groups B and C similarly, and the threshold value TH is decided for each group. Regarding the flow chart in FIG. 16, decision processing of the threshold value TH will be described below. First, in step S1, the number of switched blocks, i is set at zero. Then, in steps S2 to S9, the unit performs entropy coding with switching the good-mode and bad-mode respectively as shown in FIG. 15 to the data used for decision of the threshold value TH. In this case, the threshold value TH(i) varies to each TH(i)=1, . . . , n for each number of switched blocks, i=1, 2, 3, . . . In the first processing, since TH(0)=0 for i=0, the unit certainly performs the bad-mode coding in step S7. After the first entropy coding, the process advances from step S2 to step S10, and the unit calculates the total amount of codes, P[i] for i=0. Successively, in step S11, the unit tests whether the number of switched blocks, i exceeds the maximum value, and if not, the unit counts i up by one. Further, in steps S2–S9, the unit applies again the entropy coding with switching bad-mode coding and good-mode coding respectively to the same data as those in the first coding. In this time, i=1, and hence, the threshold value TH(i)=2 in step S8. Therefore, the unit applies the bad-mode coding in step S7 to the second block from the head, and applies the good-mode coding in step 9 to the third block and succeeding ones. After coding, the unit calculates the total amount of codes, P[i] for i=1 in step S10. Above processing is repeated until the number of switched blocks, i exceeds the maximum value, for example, n. Further, when each total amount of codes, P[0], . . . , P[n] is obtained for each i=0, . . . , n, the process goes to step S13 to substitute the number of switched blocks, i to the threshold value TH. Regarding the decision process of the threshold value TH in FIG. 16, as actually performing the transformation of input data, the unit decides the optimum value of TH, for example, in the transformation process of the first group A as shown in FIG. 11. After that, the decided threshold value TH may be applied in the subsequent processes. In addition, it may be good to obtain the optimum threshold value TH through applying the process shown in FIG. 16 to the prepared typical data, and to use this TH in actual data processing.

Figure 17:
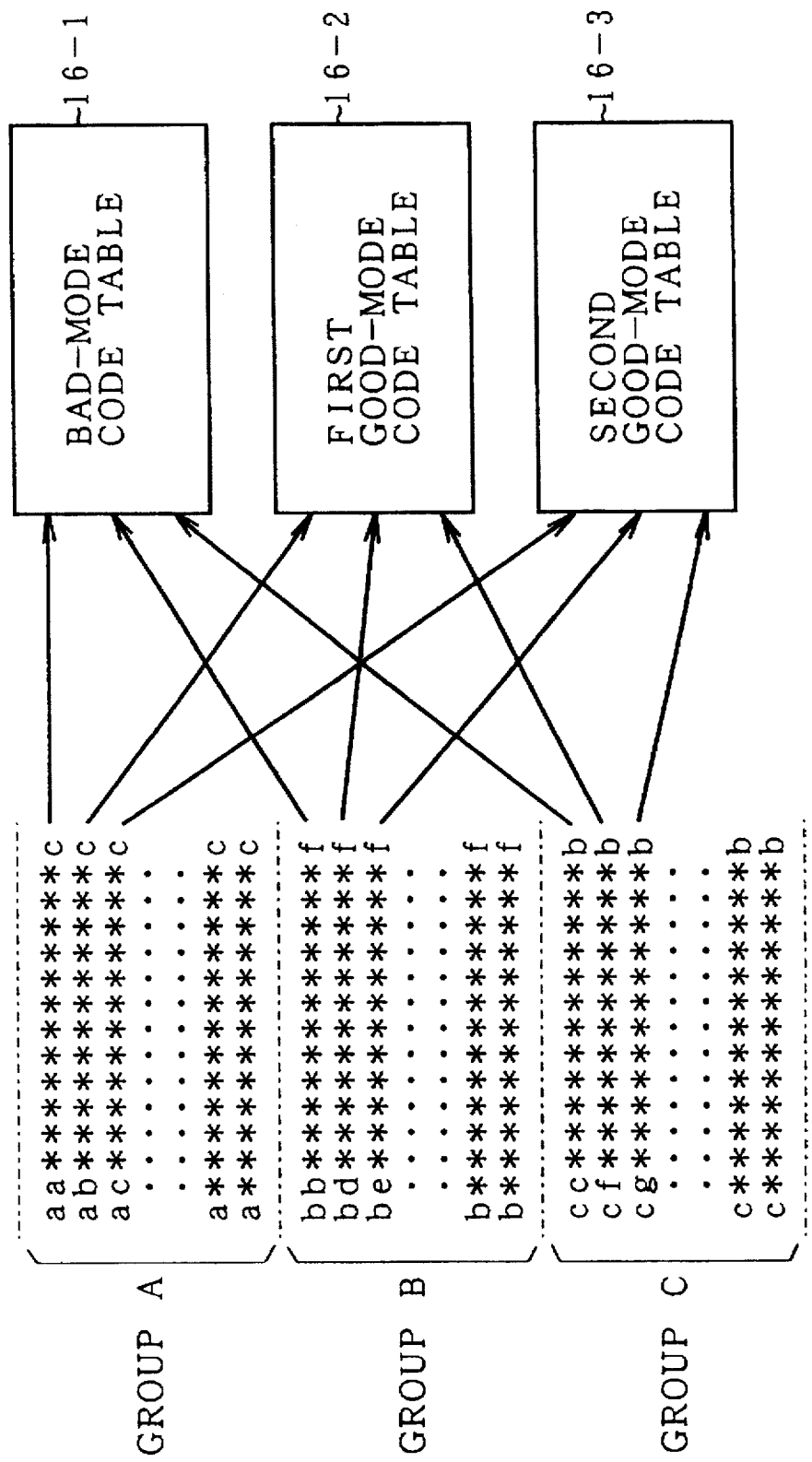
FIG. 17 is an explanatory representation showing how to select one out of two kinds of good-mode code tables using two characters starting with the head of each string.

FIG. 17 shows another implementation form wherein the entropy coding unit 14 selects one out of a plurality of code tables in FIG. 10. This implementation form is characterized in comprising a plurality of good-mode code tables. For example, regarding a discontinuous part of the group A, B, or C whose block-sorted character strings are similar each other, similarly to the processing by the implementation form shown in FIG. 11, the unit 14 encodes the first block from a discontinuous part with using the bad-mode code table 16-1, and encodes the second block and succeeding ones with good-mode code tables. In regard to the good-mode coding of from the second block to succeeding ones, in FIG. 17, the unit has two kinds of code tables corresponding to the first two-characters of a block-sorted character string, the code tables which are a first good-mode code table 16-2 and a good-mode code table 16-3. The first good-mode code table 16-2 and second good-mode code table 16-3 are used as follows. For example, taking the group A as an example, in regard to the first two-characters of each character string after the second block at which coding is switched to the good-mode coding, the first characters are identical as "a", and hence, good-mode coding is kept. Further, the unit applies the coding with selecting the first good-mode code table 16-2 for the second character "b", and applies the coding with using the second good-mode code table 16-3 for a different second character "c". Regarding the next groups B and C, when the mode transfers to the good-mode, the unit selects the first good-mode code table 16-2 or second good-mode code table 16-3, depending on the second character of the block-sorted character string in each block.

Although the implementation form in FIG. 17 exemplifies proper use of a plurality of good-mode code tables corresponding to the first two-characters when coding transfers to the good-mode coding, it may be good to prepare good-mode code tables corresponding to the cases that a plurality of characters such as the first three-characters or four-characters is different each other similarly to the above.

Figure 18:
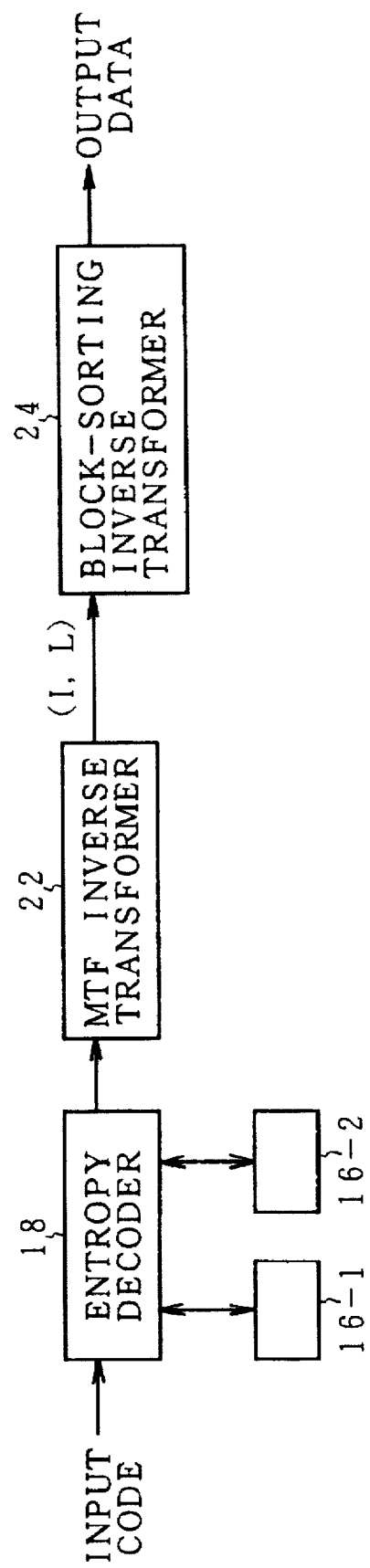
FIG. 18 is a block diagram of an apparatus for data decompression according to the present invention for decompressing to an original character string the code string obtained in FIG. 10.

FIG. 18 is a block diagram of an apparatus for data decompression according to the present invention for decompressing a code string transformed by the apparatus for data compression shown in FIG. 10. This apparatus for data decompression comprises an entropy decoding unit 18, an MTF inverse transforming unit 22, and block-sorting inverse transforming unit 24. The entropy decoding unit 18, like the entropy coding unit 14 shown in FIG. 10, comprises a bad-mode code table 16-1 and a good-mode code table 16-2, and decodes an entropy-coded code string into an intermediate code becoming an MTF code string. The MTF inverse transforming unit 22 inputs an MTF code string as an intermediate code decoded in the entropy decoding unit 18, and decodes it into a pair (I, L) which is a combination of a block-sorted character string L and a sorted position number I. The block-sorting inverse transforming unit 24 inputs the output (I, L) from the MTF inverse transforming unit 22, and decomposes it into the original character string S. The bad-mode code table 16-1 has, for example, the contents shown in FIG. 14, the good-mode code table 16-2 has, for example, the contents shown in FIG. 13, and switching of both code tables is decided with the threshold value TH. The threshold value TH of the number of switched blocks can be fixed, for example, at TH=1, and it may be also good to set the optimum threshold value TH, decided in the process shown in FIG. 16, into the apparatus for data decompression for switching.

Figure 19:
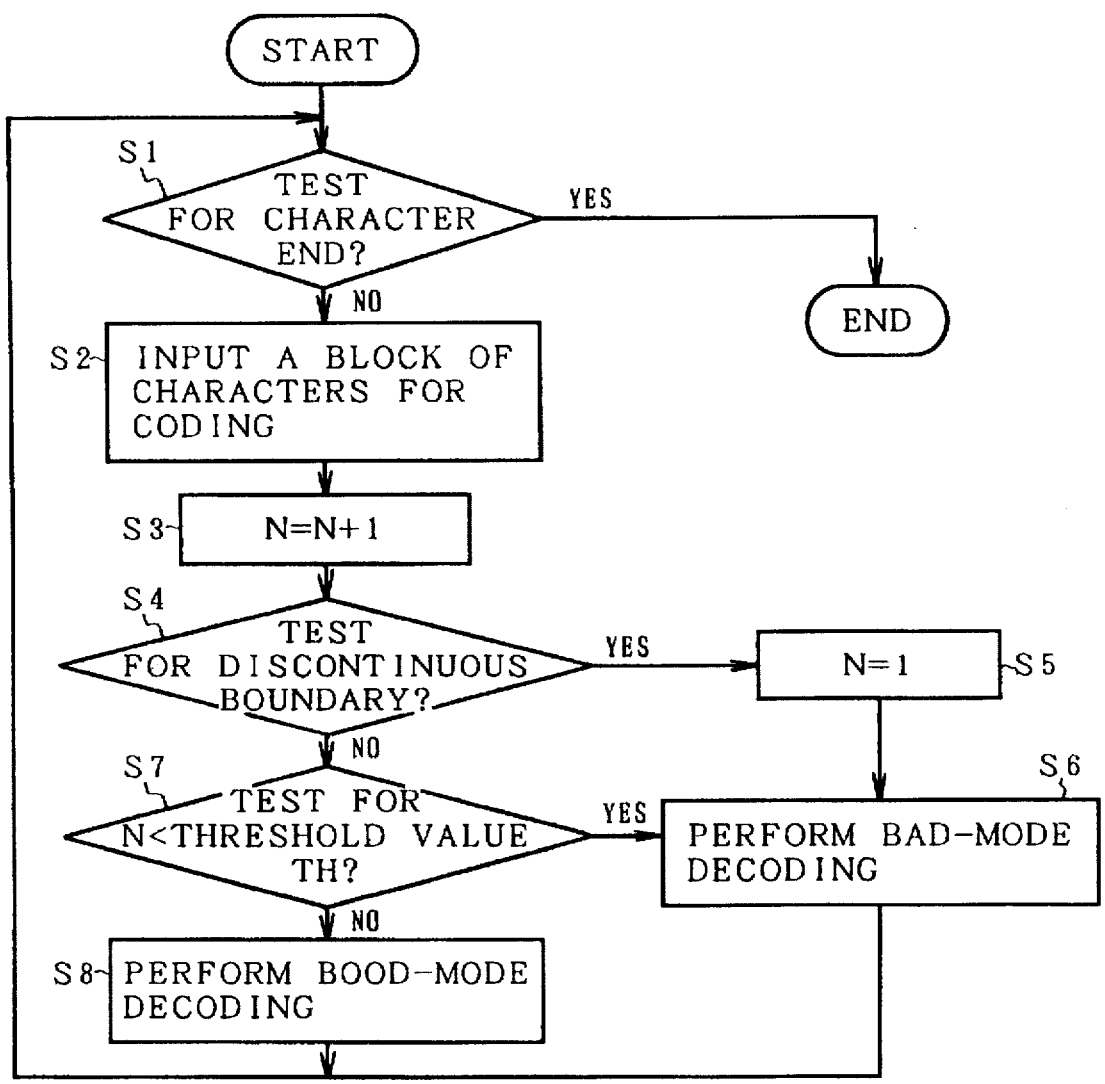
FIG. 19 is a flow chart of entropy decoding processing shown in FIG. 10.

The flow chart in FIG. 19 shows decompression processing by the entropy decoding unit 18 in the apparatus for data decompression shown in FIG. 18. First, in step S1, the unit tests the end of a code to be processed, inputs a block of code string in step S2, and performs an increment of the number of processed blocks, N by one in step S3. Successively, the unit tests whether the block is a discontinuous part in step S4, and if so, the unit sets N as N=1 in step S5 and performs the bad-mode decoding with using the bad-mode code table in step S6. The unit certainly applies the bad-mode decoding to a code string of the first block and the first block from detecting a discontinuous part during decoding. The process goes to the next block after the bad-mode decoding, and if the block is not a discontinuous part in step S4, the unit tests whether the number of processed blocks, N is equal to or less than the threshold value TH in step S7. If N is equal to or less than the threshold value TH, the unit performs the bad-mode decoding in step S6. If N exceeds the threshold value TH, the process goes to step S8, and the unit performs the good-mode decoding with switching to the good-mode code table. Similarly to the above, the unit switches to the bad-mode decoding every occurrence of a discontinuous part, and after processing the predetermined number of blocks, the unit repeats the good-mode decoding again.

Figure 20:
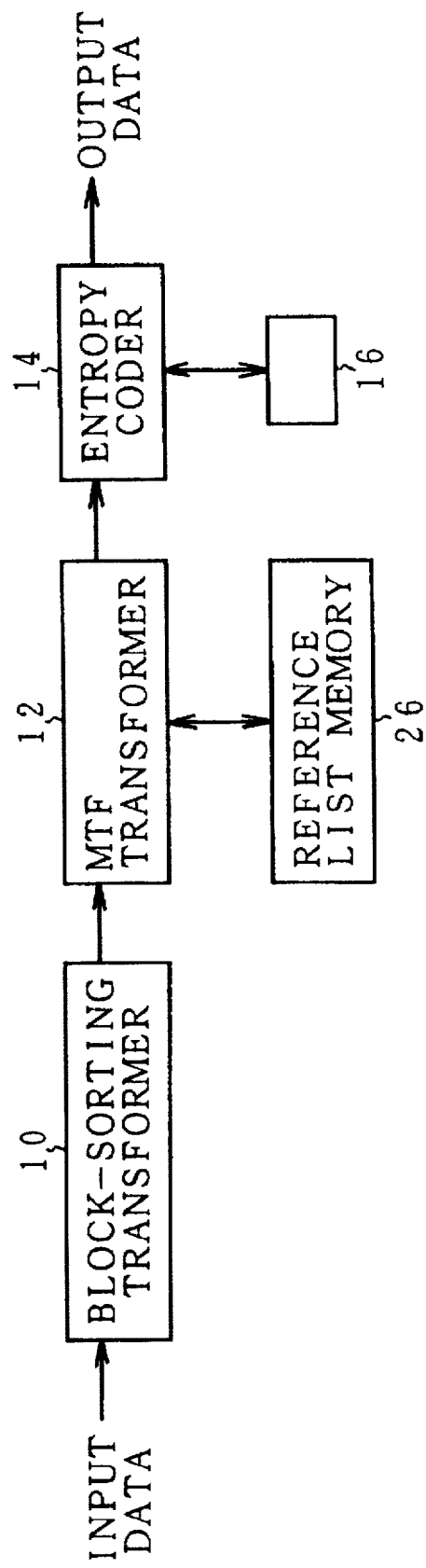
FIG. 20 is a block diagram of an apparatus for data compression according to the present invention for selecting a used list out of a plurality of reference lists and performing MTF transformation.

FIG. 20 is a block diagram of another implementation form of an apparatus for data compression according to the present invention. This implementation form is characterized in having a plurality of reference lists used for the MTF transformation and using the reference lists each for a group A, B, or C, as shown in FIG. 11. This implementation form of the apparatus for data compression comprises the block-sorting transforming unit 10, MTF transforming unit 12, and entropy coding unit 14. The block-sorting transforming unit 10 is the same unit as the implementation form in FIG. 10. The unit divides an input data of a character string into, for example, 64-kilobyte blocks, generates a two-dimensional character matrix with rotating a character string in a block counterclockwise by the number of characters of the string, sorts the strings lexicographically, and transforms these strings into a block-sorted character string with sorting and picking up the last characters of the strings. At the same time, the unit also outputs a number I showing the row position of the current character string in the block-sorted two-dimensional character matrix. That is, the block-sorting transforming unit 10 outputs a block-sorted character string (I, L). The MTF transforming unit 12 uses a reference list including all kinds of the characters to be processed, and transforms characters starting with the first character of a block-sorted character string from the block-sorting transforming unit 10 in turn into a code showing registered positions on the reference list. At the same time as this transformation, the unit moves the character used for this transformation to the head of the reference list Y to update the reference list for transformation of the next character.

The implementation form shown in FIG. 20 has a plurality of reference lists used by the MTF transforming unit 12 each for a local group whose block-sorted character strings are similar each other, the reference lists which are stored in a reference list memory 26. For example, let the kinds of characters to be processed by the apparatus for data compression be 256, and then 256 reference lists respectively corresponding to 256 kinds of characters are stored in the reference list memory 26. Here, let the number of kinds of characters be i=0, . . . , 255, and then 256 kinds of reference lists are prepared as Y(0), . . . , Y(255). For example, for simple explanation, let the number of kinds of characters be 26 alphabets, and then the reference lists Y(a), . . . , Y(z) each are prepared for each character "a", . . . , "z". The reference list Y(a) for the character "a" is obtained by sorting 26 alphabets lexicographically, and has the first character "a" as follows:

$$Y(a)=a, b, c, d, \ldots, x, y, z$$

The reference list Y(b) for the next character "b" is as follows:

$$Y(b)=b, a, c, d, \ldots, x, y, z$$

Similarly to the above, reference lists each are prepared for each character, and regarding the last character "z", $$Y(z)=z, a, b, c, \ldots, x, y$$

Figure 21:
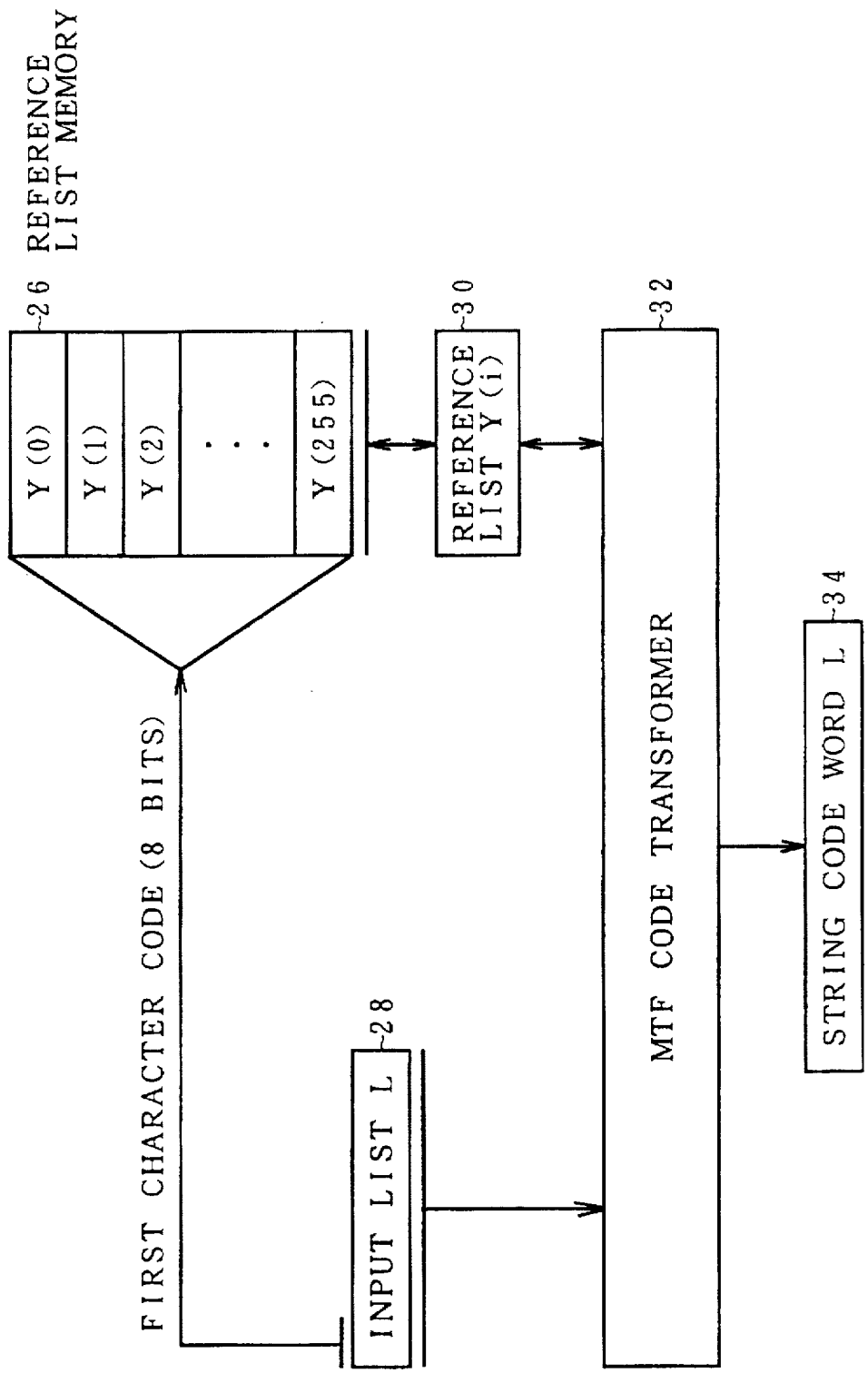
FIG. 21 is a block diagram of a function for selecting a reference list using the first character shown in FIG. 20.

FIG. 21 is a functional block diagram of the MTF transforming unit 12 and reference list memory 26 shown in FIG. 20. First, the reference list memory 26 stores the reference lists Y(0), . . . , Y(255) respectively corresponding to each of 256 kinds of characters. The first character of a block-sorted character string L, to which MTF transformation is applied and which is stored in a register 28 as an input list L, is used as an entry for selecting each reference list. Therefore, when the input list L to be transformed is set in the register 28, the entry of the reference list memory 26 is specified by the character code i of the first character. Then, the unit reads a corresponding reference list Y(i) into the register 30. An MTF transforming unit 32 uses the reference list Y(i) in the register 30, and transforms the input list L starting with the first character in the register 28 in turn into a code (distance from the head) showing a position on the reference list Y(i). Next, the unit outputs a transformed code word of a character string to a register 34 as an intermediate code.

Again referring to FIG. 20, an MTF code string of a block-sorted character string transformed by the MTF transforming unit 12 is sent to the entropy coding unit 14 to be transformed to a variable length code. The entropy coding unit 14 has a code table 16, which is referred every code unit of an MTF code string for transformation into a code word. It is desirable to perform spraies coding using dynamic Huffman coding and so on. Of course, it may be also good to perform a coding using static Huffman coding.

Figure 1:
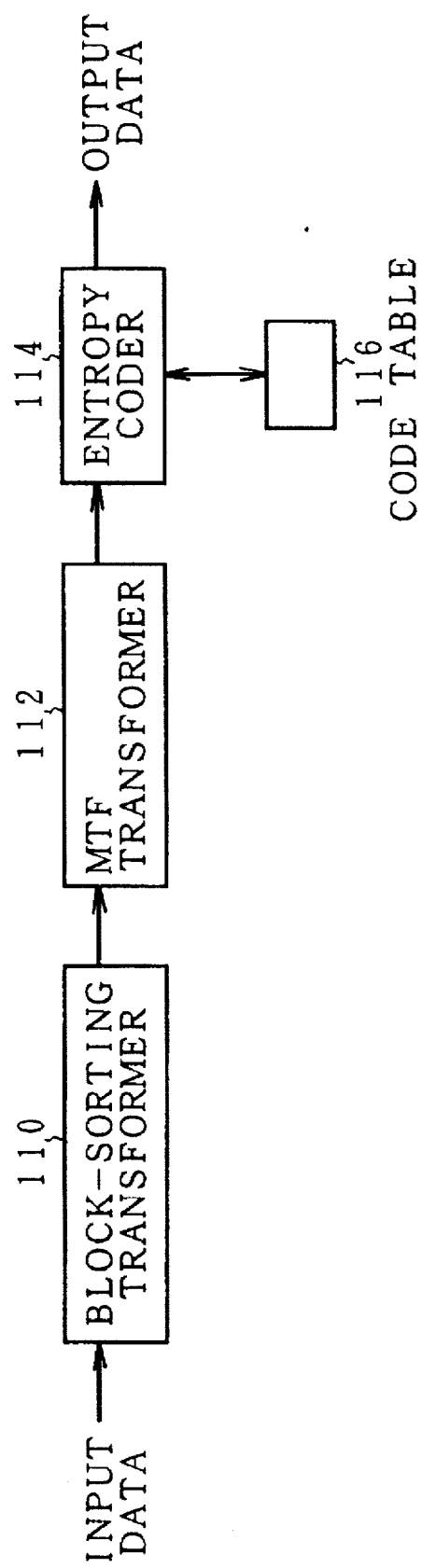
FIG. 1 is a block diagram of a conventional apparatus for data compression where a block-sorting algorithm is adopted.
Figure 2:
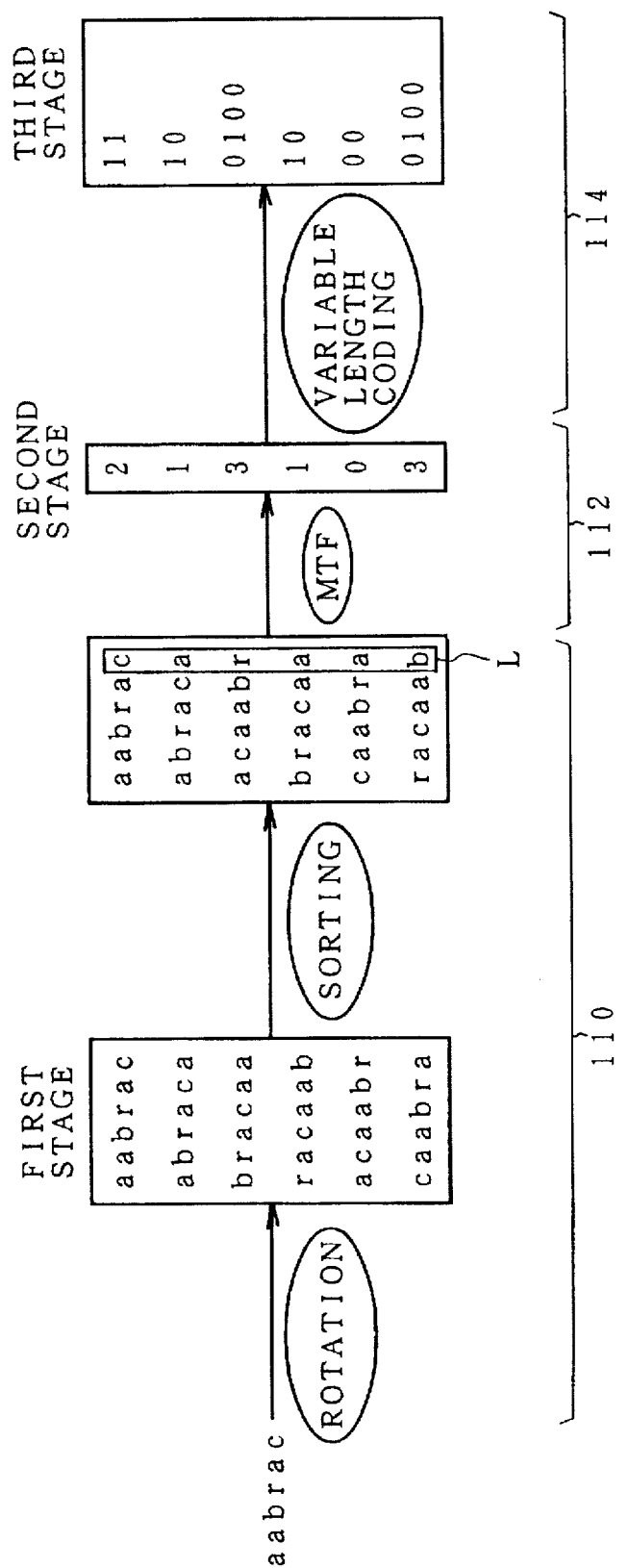
FIG. 2 is an explanatory representation of processing functions of a block-sorting algorithm.
Figure 4A:
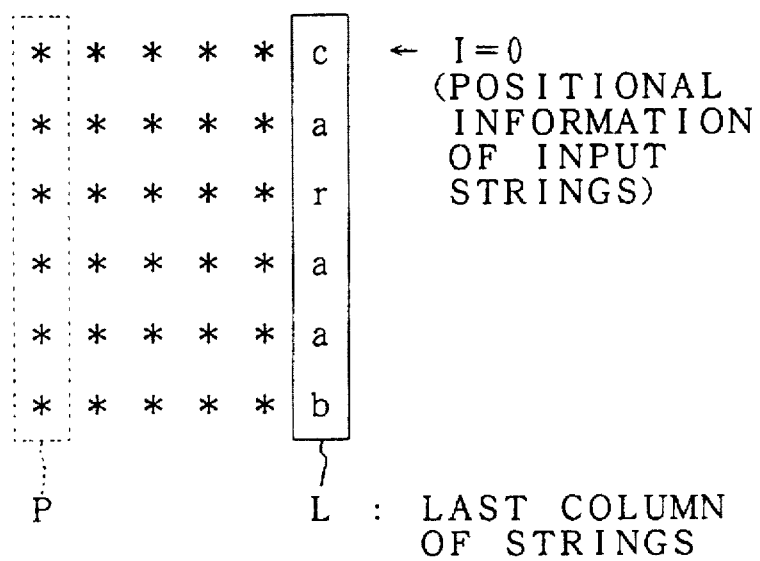
FIGS. 4A and 4B each are a representation for explaining a principle of decompression of a sorted last character string to an input string.
Figure 4B:
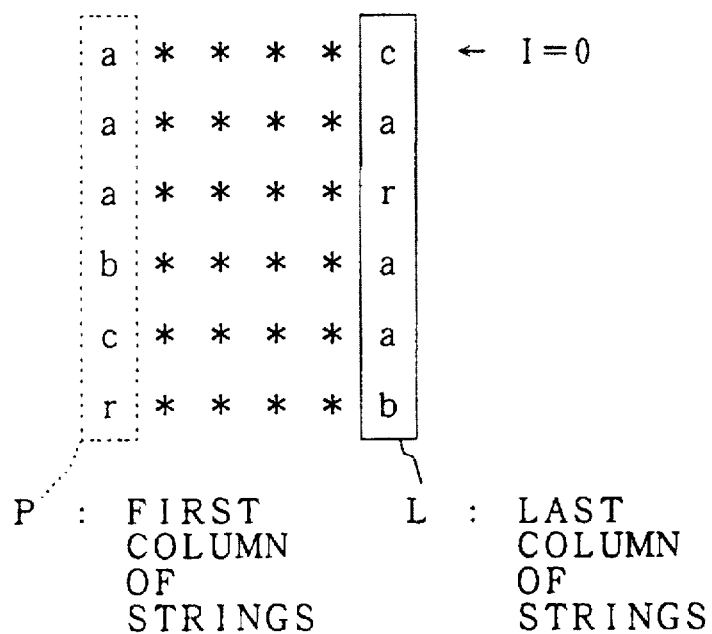
Figure 5:
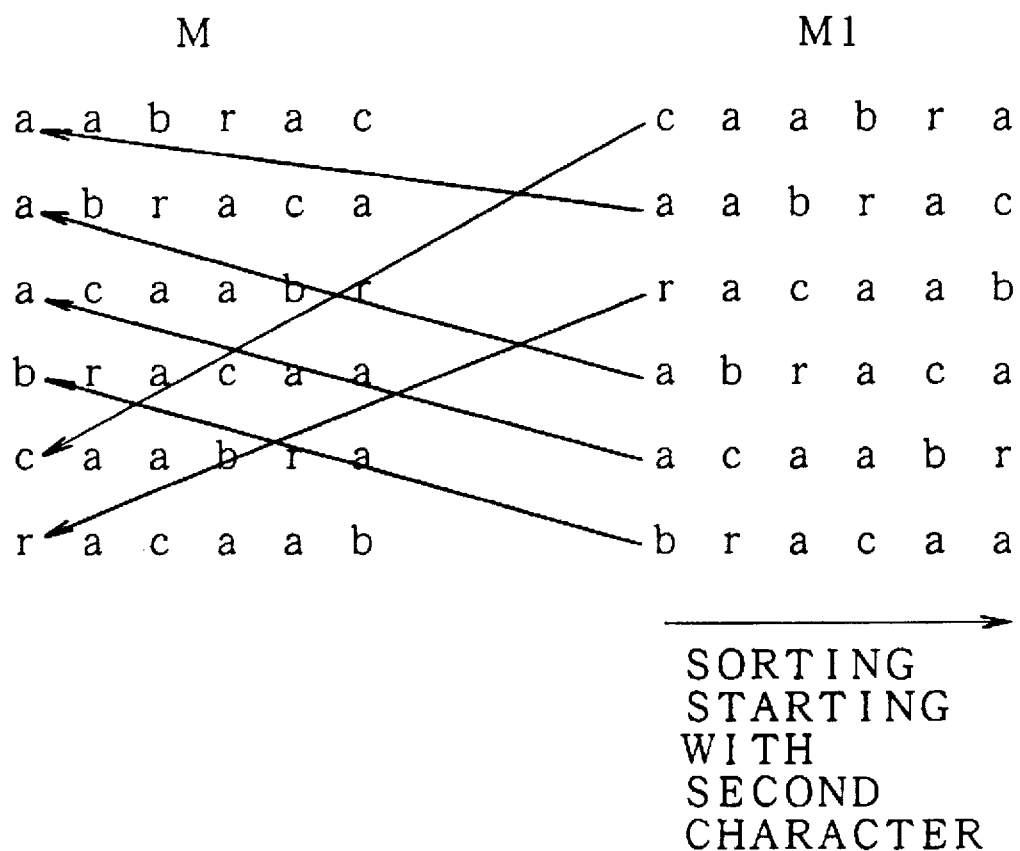
FIG. 5 is an explanatory representation showing correspondence relation between a sorted two-dimensional character matrix and a two-dimensional character matrix that is generated with rotating the former matrix clockwise once.
Figure 6A:
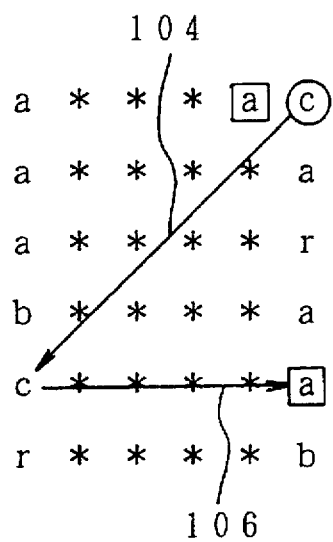
FIGS. 6A to 6D each are an explanatory representation showing decompression processing of each character according to the principle shown in FIG. 5.
Figure 6B:
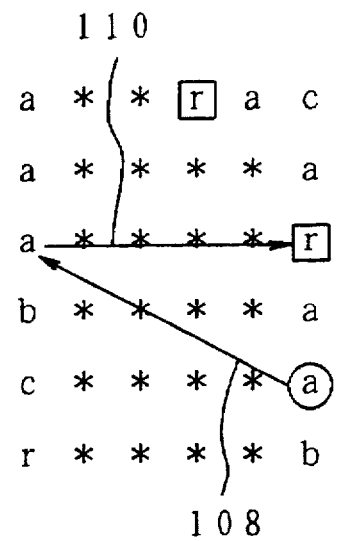
Figure 6C:
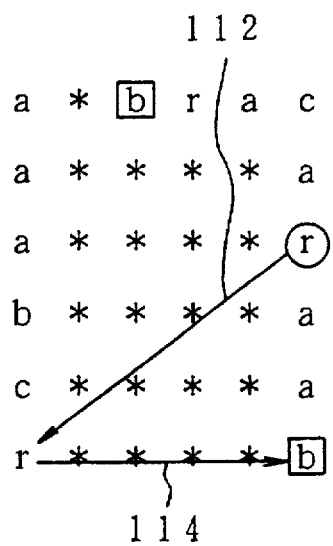
Figure 6D:
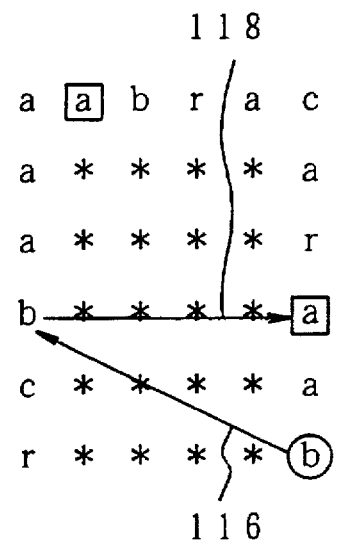
Figure 22:
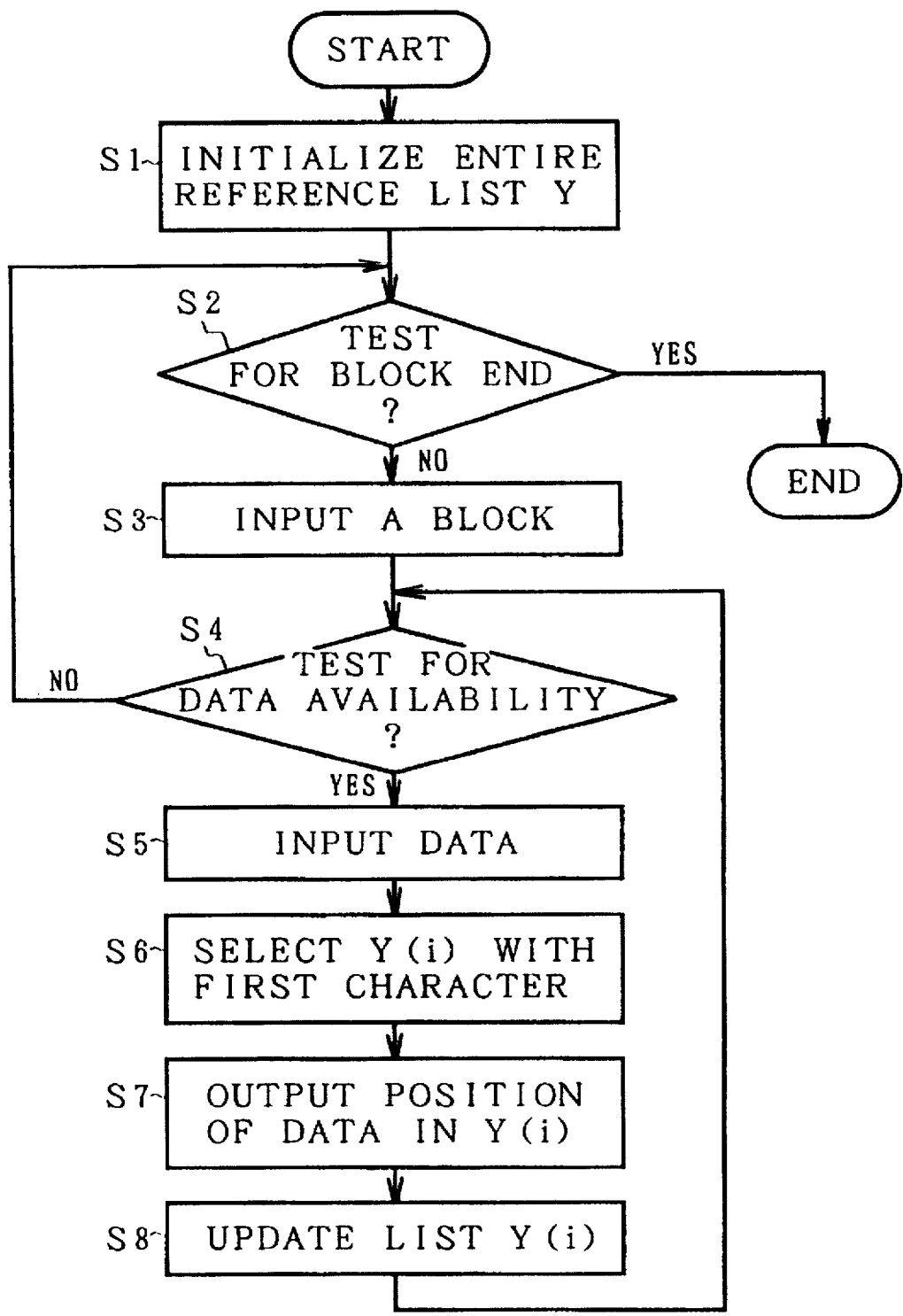
FIG. 22 is a flow chart of the MTF transformation shown in FIG. 20.

FIG. 22 is a flow chart of transformation processing by the MTF transforming unit 12 shown in FIG. 20. In FIG. 22, first, in step S1, the MTF transforming unit 12 initializes all of the reference lists in the reference list memory 26 used by the MTF transforming unit 12. Since reference lists used in previous data stream processing are sometimes updated and therefore defer from original contents, this initialization is a process to let them return to the preset initial state. In the implementation form shown in FIG. 20, the initialization of reference lists in step S1 is performed only at the initial stage where a series of data stream processing starts, and it is not performed during each block processing after division into blocks. On the other hand, in the conventional MTF transforming unit 112 shown in FIG. 1, the initialization to let the reference list return to the initial state is performed every completion of one-block transformation. Successively, in step S2, the unit tests process completion of all blocks. After that, the unit receives a block-sorted character string of the first block, transformed by the block-sorting transforming unit 10. Next, if data is there in step S4, data of a block-sorted character string is inputted in step S5, and the unit selects a reference list Y(i) corresponding to the first character i. Subsequently, in step S7, the unit applies the MTF transformation using the selected reference list Y(i) to the block-sorted character string starting with the first character in turn to obtain a code showing registered positions on the reference list. Of course, the unit moves the character, used for the transformation, to the head every transformation of each character for updating the reference list Y(i). After the unit completes transformation of the block-sorted character string into the MTF code string in step S7, the unit writes the present reference list Y(i) in the reference list memory 26 in step S8 for updating the reference list. Next, the unit tests existence of data in step S4 again, and if not, the process returns to step S3 through step S2 again. Then, the unit receives the next block-sorted character string, performs MTF transformation with selecting a reference list corresponding to the first character of the inputted block-sorted character string in steps S4 to S8, and repeats above processing until completion of all blocks. As shown above, the unit selects a reference list corresponding to the first character of a block-sorted character string, and updates the reference list after transformation of a block-sorted character string by rewriting the reference list in the reference list memory 26. Further, if the unit receives the same first character as the former one, it uses the same reference list that has already been updated. By means of this processing, the reference list updated in the process of a previous block can be reflected to MTF transformation of subsequent blocks having the same first characters. For example, in case a block-sorted character string having local groups A, B, and C as shown in FIG. 11 is obtained, the MTF transformation of this character string is performed with selecting a reference list corresponding to, for example, the first character "a" of the first block-sorted character string in the group A. Further, the reference list updated during that processing is stored again in the reference list memory 26. Therefore, when a reference list is selected corresponding to the first character "a" of the second block-sorted character string, the reference list updated in the processing of the first block is used. Hence, since composing characters on the reference list is biased almost to around the head due to move-to-front of characters in the MTF transformation, it is possible to let transformed codes showing registered positions on the reference list significantly be biased to around zero which needs only short bit length. In addition, at a discontinuous part where context changes from the group A to the group B, a reference list having the first character "b" is selected in correspondence to the first character "b" of the first block-sorted character string at the discontinuous part. Therefore, it can be done to let all MTF codes of the first characters of the first block at the discontinuous part be zero, and hence, coding efficiency of the first characters of blocks can be drastically increased.

Figure 23:
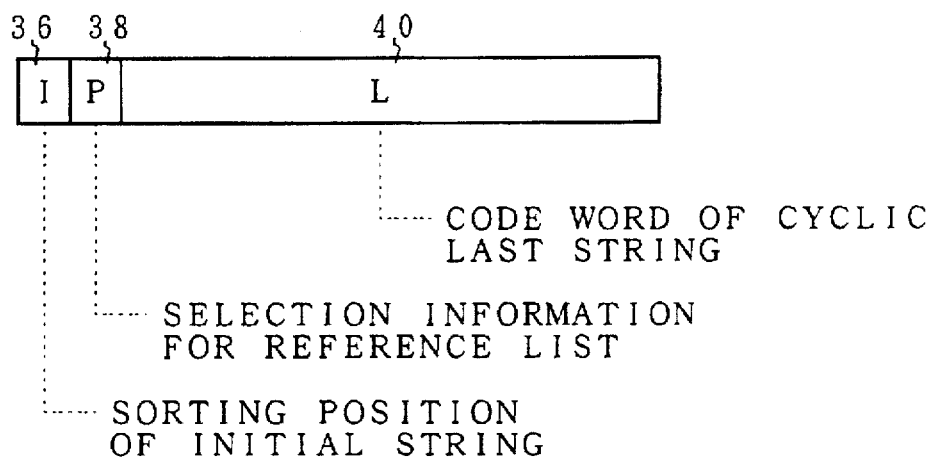
FIG. 23 is an explanatory representation of a format of the MTF transformation code shown in FIG. 20.
Figure 24:
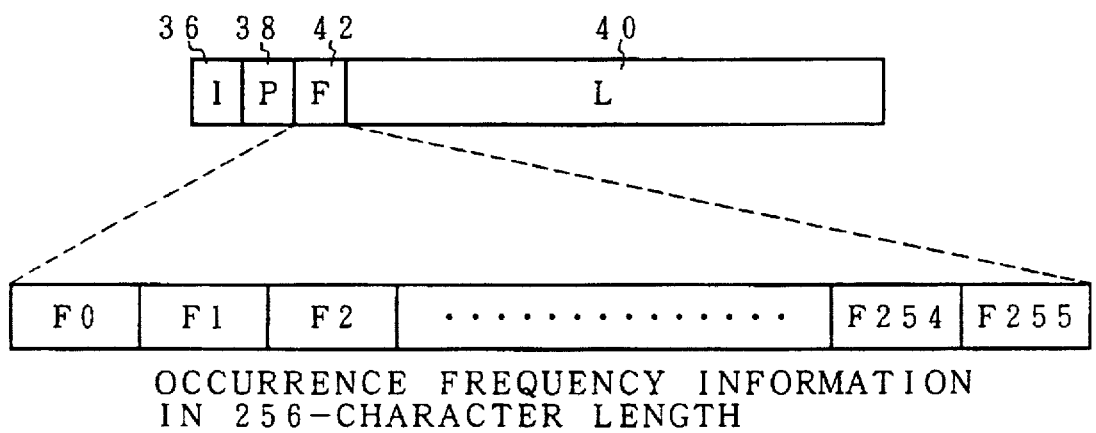
FIG. 24 is an explanatory representation of a format of an MTF transformation code transmitting usage frequency of reference lists.

FIG. 23 is an explanatory representation of a format of a code outputted from the MTF transforming unit 12 shown in FIG. 20. The MTF transforming unit 12 shown in FIG. 20 performs the MTF transformation with selecting from the reference list memory 26 a reference list corresponding to the first character of a block-sorted character string. However, which reference list was used cannot be judged in the decoding side. Therefore, as shown in FIG. 24, a code format outputted from the MTF transforming unit 12 is composed of: a sorted position field 36 showing the sorted row number I of the original string S; a list information field 38 for storing selection information P of a reference list used in the MTM transformation; and a code field 40 for storing an MTF code string of a cyclic last character string. The bit length of the list information field may be 8 bits, if the number of reference lists used in correspondence to 256 kinds of characters is 256.

FIG. 24 shows another implementation form of a code format outputted from the MTF transforming unit 12. This implementation form newly includes a frequency information field 42 for storing information on occurrence frequencies of characters in the apparatus for data compression, namely, occurrence frequencies of 256 characters. The frequency information field 42, as shown below under magnification, has storing spaces of occurrence frequencies of 256 characters, F0, F1, . . . , F255. The bit length of each occurrence frequency F0, F1, . . . , or F255 depends on a block length per process. For example, let the block length be 256 bytes, and then, since the maximum frequency becomes 256 in case of a block-sorted character string composed of all identical characters, the bit length is 8. Since there are 256 occurrence frequencies, the bit length of the frequency information field 42 is:

256 characters×8 bits=256 characters×1 byte=256 bytes.

On the other hand, let the block length be 64 kilobytes, and then, since the maximum frequency becomes 65536 in case of a block-sorted character string composed of all identical characters, the bit length is 16. Since there are 256 occurrence frequencies, the bit length of the frequency information field 42 is:

256 characters×16 bits=256 characters×2 byte=512 bytes.

For generation of reference lists in the apparatus for data decompression, 256 occurrence frequencies, F0, . . . , F255 of the frequency information field 42 transmitted to the encoding side according to the format shown in FIG. 24 are used. That is, if the occurrence frequency is 0, the reference list corresponding to the occurrence frequency "0" is nit used, and hence, it is not necessary to prepare the reference lists corresponding to the characters, whose occurrence frequencies are "0", in the apparatus for data decompression. Therefore, it is sufficient to prepare only reference lists corresponding to characters whose occurrence frequencies are not "0", but effective numbers. Thus, since it becomes possible to focus necessary reference lists to be prepared in the apparatus for data decompression, it becomes possible to decrease the size of the reference list memory 26 used in the apparatus for data decompression.

FIGS. 25A–25B shows other implementation form of the output format of the MTF transforming unit 12. This implementation form is characterized in dividing the frequency information field 42 into an effectiveness identification field 42-1 and an effective frequency information field 42-2. The effectiveness identification field 42-1 stores a 256-bit bit map one bit of which corresponds to one of 256 characters. That is, if a character occurs, the corresponding bit becomes one, and if not, the bit becomes zero. Next, the effective frequency information field 42-2 stores occurrence frequencies F1, . . . , F255 only for characters having bit 1 in the effectiveness identification field 42-1, that is, occurring in a block-sorted character string. For example, as shown in FIG. 25B, if the bit map of the effectiveness identification field 42-1 is "101 . . . 101", only occurrence frequencies F1, . . . , F255 of characters showing bit 1, namely, being effective are stored in the effective frequency information field 42-2. Therefore, it becomes possible to decrease total bit length of the effective frequency information field 42-2.

Figure 26:
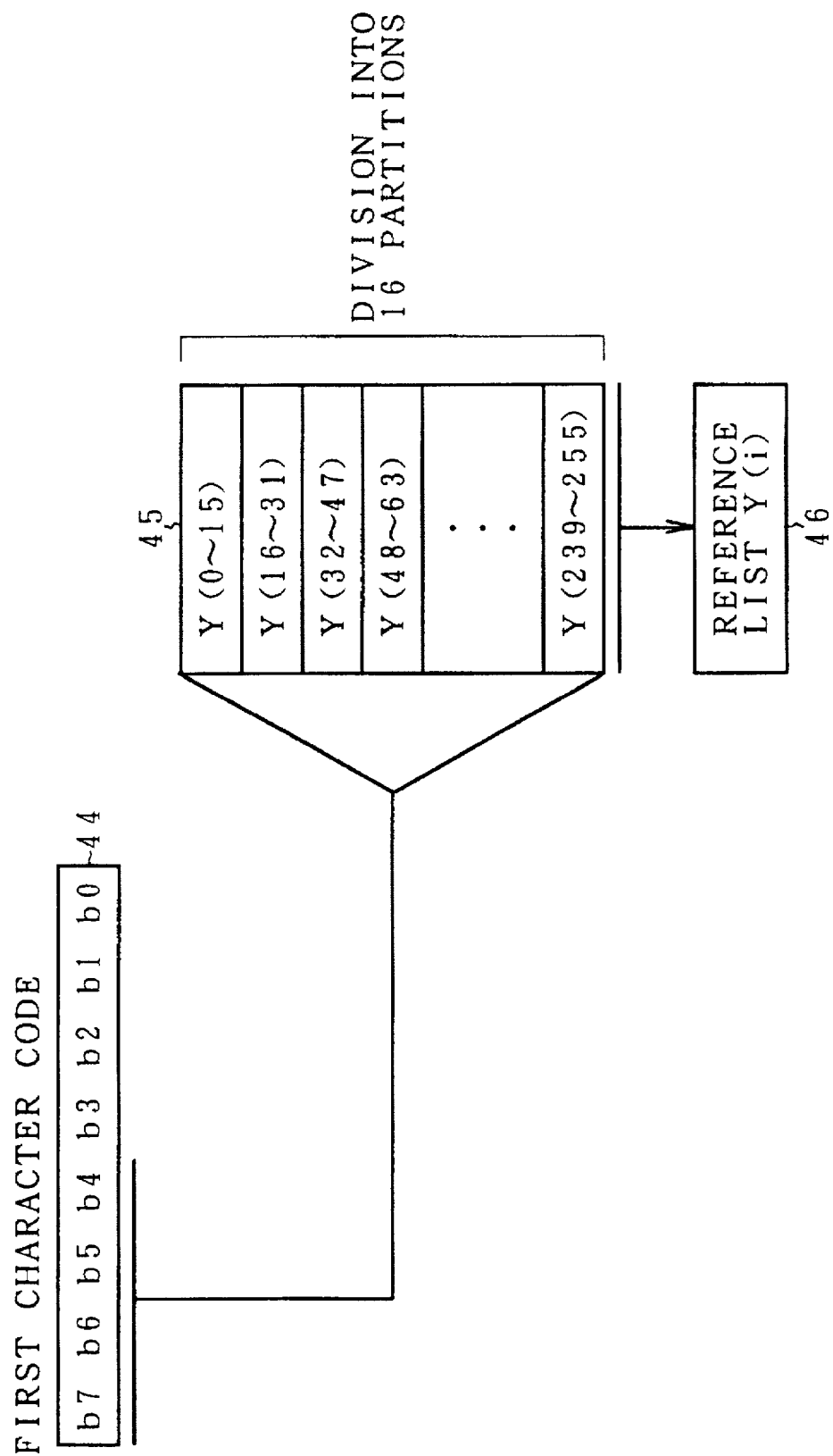
FIG. 26 is a block diagram of a function for selecting a reference list using upper four bits of a first character code.

FIG. 26 is a functional block diagram showing other implementation form of selecting a reference list in the MTF transforming unit 12 shown in FIG. 20. In regard to selection of a reference list shown in FIG. 21, a reference list is selected from a reference list memory 45 in correspondence to all bits of the first character code of a block-sorted character string to which MTF transformation is applied, concretely, 8-bit information. On the other hand, The implementation form shown in FIG. 26 is characterized in selecting a reference list from the reference list memory 45 in correspondence to, for example, the first 4 bits of the first character code. For example, let a character be expressed in 8 bits, and then, an entry of the reference list memory 45 is specified by the upper 4 bits b7–b4 of the 8-bit first character code stored in a register 44. For this reason, it is possible for the entry of the reference list memory 45 to express 16 kinds of the first characters with upper 4 bits. Therefore, a number of entries is 256/16=16, namely, 16 entries, and hence, 16 reference lists are prepared. Thus, 16 characters are set as one group, and thereby 16 reference lists Y(0–15), Y(16–31), . . . , Y(239–255) are prepared. In addition, although the upper 4 bits of a first character code is exemplified in FIG. 26, it may be good to prepare reference lists corresponding to the lower 4 bits of the code. Further more, it may be also good to prepare reference lists corresponding to a plurality of any bits.

Figure 27A:
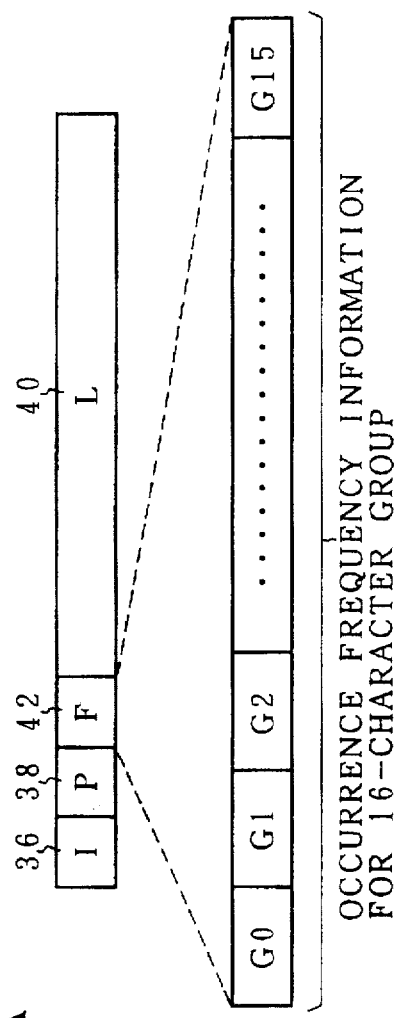
FIGS. 27A and 27B each are an explanatory representation of a code format having usage information of reference lists shown in FIG. 26.
Figure 27B:
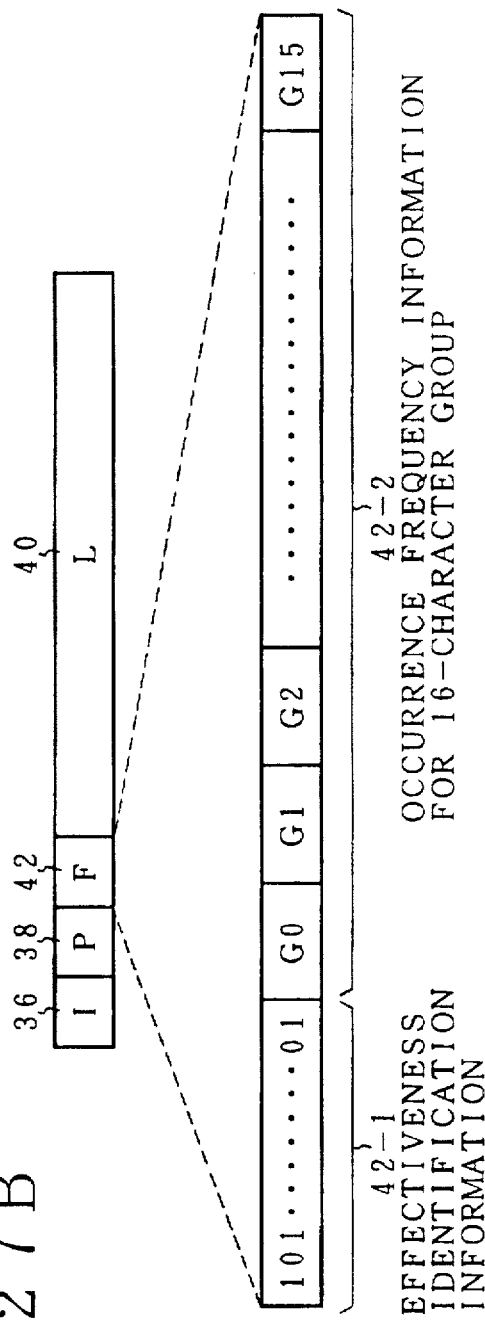

FIGS. 27A–27B show an output format of an MTF code string in the case of reference lists for 256 characters which are divided into 16 groups with upper 4 bits of a first character code shown in FIG. 26. The format shown in FIG. 27A has: a list information field 38 for sending identification information B of a used reference list in the case of the MTF transformation with selecting a reference list from 16 lists shown in FIG. 26; and a frequency information field 42 for sending occurrence frequencies G0, . . . , G18 for 16 groups. In this case, so long as the list information field 38 storing used list information P can express 16 kinds, the field is 4 bits. In addition, regarding the frequency information field 42, each of occurrence frequencies G0–G18 that corresponds to 16 characters is:

8 bits×16 characters=16 bytes, and hence, its size may be 256 bytes. In FIG. 27B, the frequency information field 42 is divided into an effectiveness identification field 42-1 and an effective frequency information field 42-2 for occurrence frequencies of 16 groups. Therefore, since this field stores only occurrence frequencies of groups corresponding to bit 1 in the effectiveness identification field, it is possible to shorten the bit length of the frequency information field 42.

Figure 8:
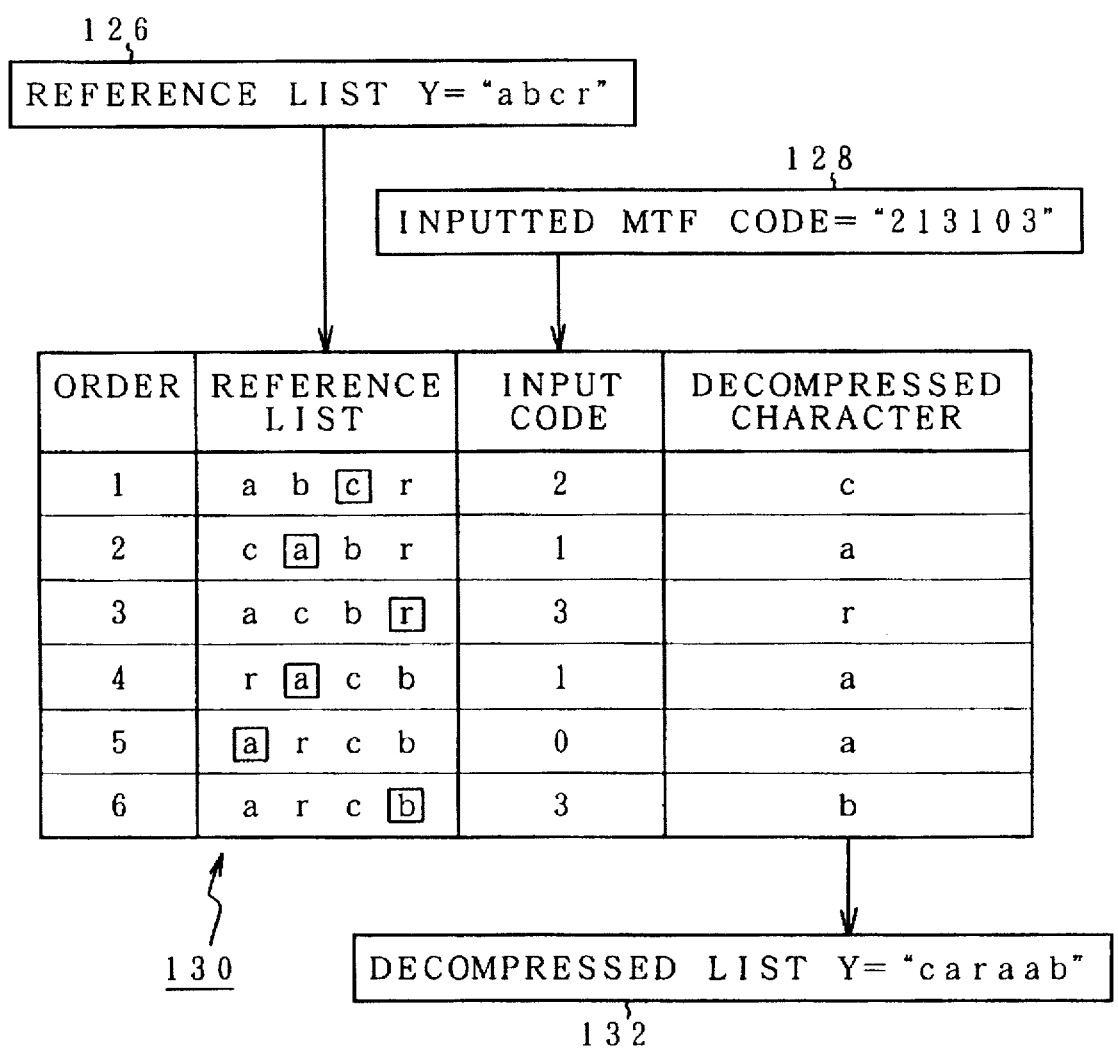
FIG. 8 is a functional block diagram of an MTF inverse transformation.
Figure 28:
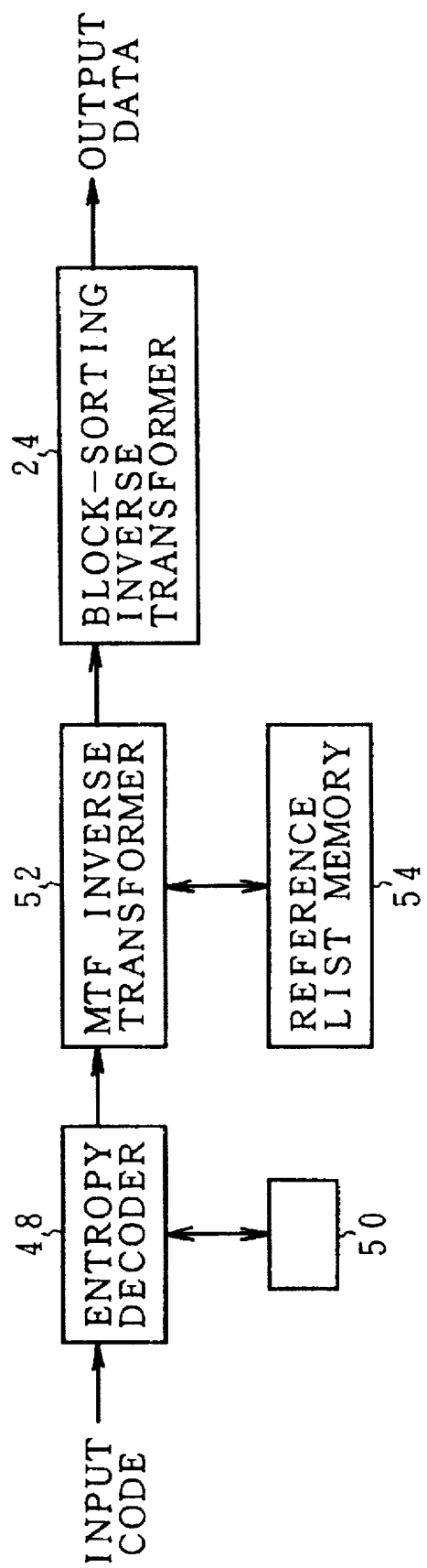
FIG. 28 is a block diagram of an apparatus for data decompression for decompressing a code string outputted from the apparatus for data compression, which is shown in FIG. 20, into a character string.

FIG. 28 is a block diagram of an apparatus for data decompression for decompressing a code string transformed by the apparatus for data compression shown in FIG. 20 into the original character string. This apparatus for data decompression comprises an entropy decoding unit 48, an MTF inverse transforming unit 52, and a block-sorting inverse transforming unit 24. The entropy decoding unit 48 uses a code table 50, and performs decoding processing corresponding to the suppression coding such as dynamic Huffman coding. The MTF inverse transforming unit 52 has a reference list memory 54, where reference lists corresponding to all kinds of characters decompressed by the apparatus for data decompression, for example, 256 reference lists in the case of 256 kinds of characters are stored. In the MTF inverse transforming unit 52, the selection information P of the reference list used in the compression side as, for example, the format shown in FIG. 23 is included in a code string received from the apparatus for data compression shown in FIG. 20. Then, based on the selection information P of the reference list, the unit selects a reference list from the reference list memory 54, and performs the MTF inverse transformation. In addition, if frequency information of an occurred character is included in a format from the compression side as shown in FIGS. 24–25, only reference lists for characters having effective frequencies which are equal to or more than 1 may be prepared, and stored in the reference list memory 54. The block-sorting inverse transforming unit 24 inputs a sorted last character string inversely transformed in the MTF inverse transforming unit 52, and decompresses this string into block-divided original character string that becomes output data. Except selection of a reference list, the MTF inverse transformation in the apparatus for data decompression, shown in FIG. 28, is the same as the conventional MTF inverse transformation shown in FIG. 8.

Figure 29:
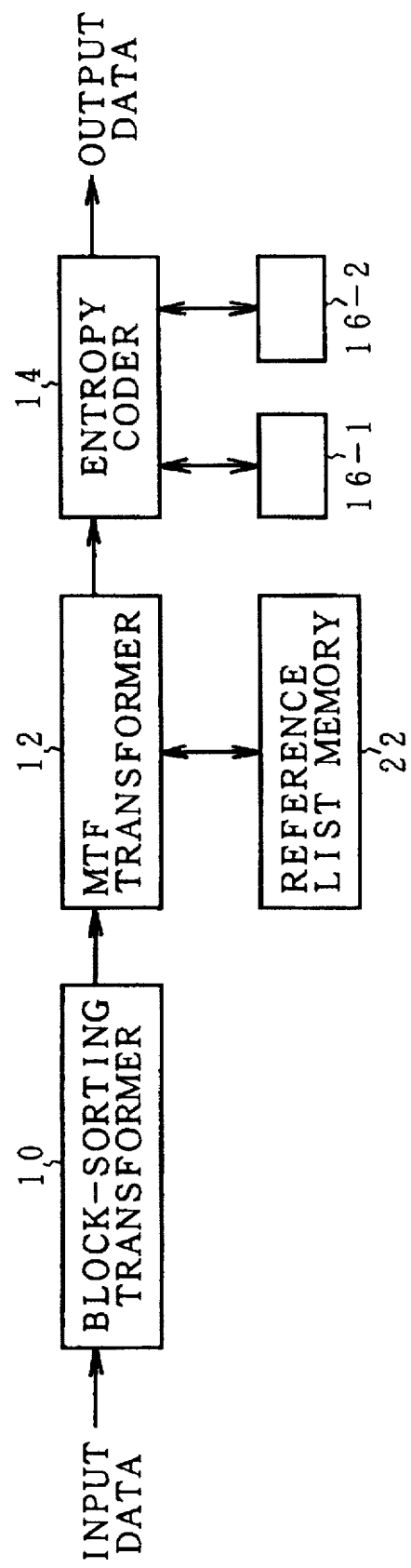
FIG. 29 is a block diagram of an apparatus for data compression that is combination of the apparatus shown in FIG. 10 and one in FIG. 20.

FIG. 29 shows a further implementation form of an apparatus for data compression according to the present invention. This form is characterized in combining the entropy coding unit 14 using the bad-mode code table 16-1 and good-mode code table 16-2 that are shown in FIG. 10, and the MTF transforming unit 12, which performs the MTF transformation with selecting a reference list from a plurality of reference lists as shown in FIG. 20, and a reference list memory 26. By means of this, it becomes possible to improve decrease of coding efficiency at a discontinuous part of context in the MTF transformation and coding efficiency at a discontinuous part of context in the entropy coding.

Figure 30:
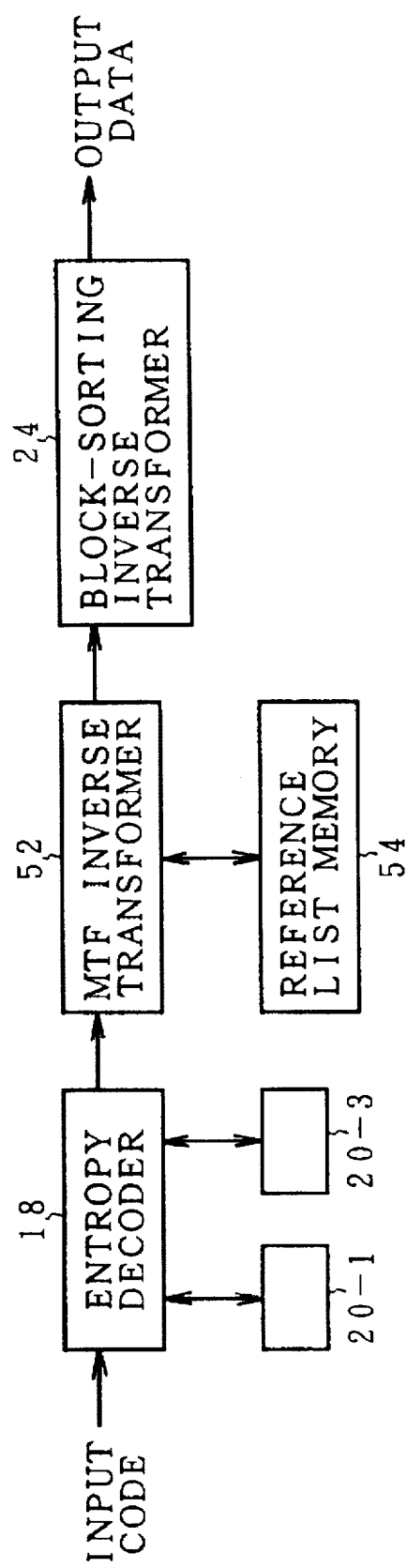
FIG. 30 is a block diagram of an apparatus for data decompression that is combination of the apparatus shown in FIG. 17 and one in FIG. 28.

FIG. 30 shows a further implementation form of an apparatus for data decompression for decompressing an outputted code from the apparatus for data compression, shown in FIG. 29. The apparatus for data decompression shown in FIG. 30 is characterized in combining the entropy decoding unit 18 using the bad-mode code table 16-1 and good-mode code table 16-2 that are shown in FIG. 18, and the MTF inverse transforming unit 52, which performs MTF inverse transformation with selecting a corresponding reference list from the reference list memory 52 as shown in FIG. 29.

Figure 31:
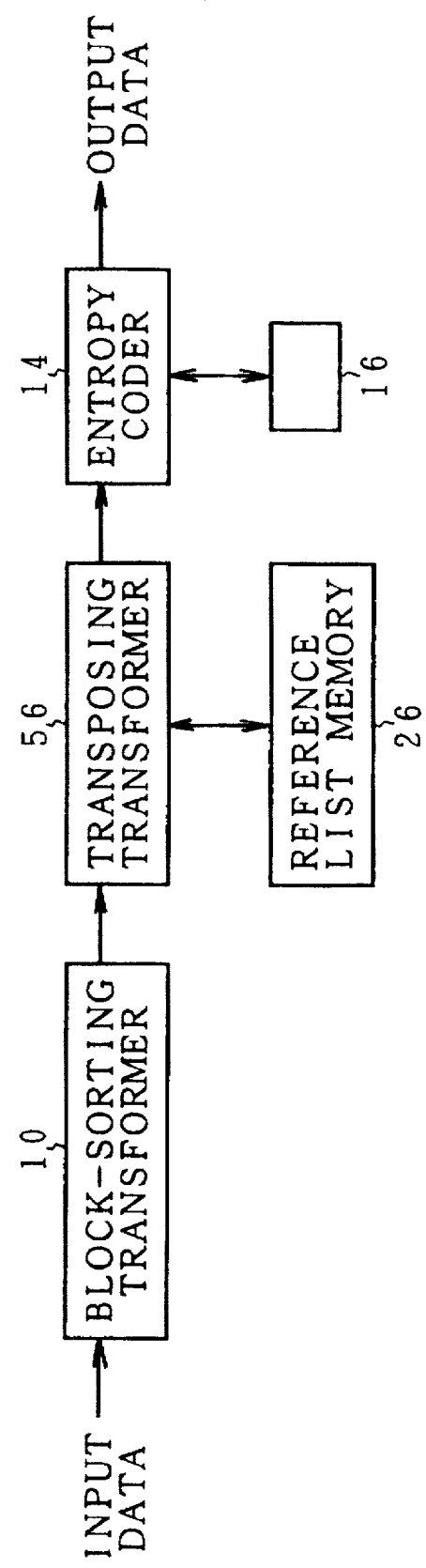
FIG. 31 is a block diagram of an apparatus for data compression whose transposing unit is replacement of the MTF transforming unit shown in FIG. 20.

FIG. 31 is an implementation form having a transposing unit 56 instead of the MTF transforming unit 12 shown in FIG. 20. After the MTF transforming unit 12 shown in FIG. 20 transforms each character of a block-sorted character string into a code showing a position from the head, the unit moves the character on the list, used for the transformation, to the head. On the other hand, the transposing unit 56 shown in FIG. 31 transforms each character of a block-sorted character string into a code showing a position from the head, and thereafter the unit performs transposition for moving the character on the list, used for the transformation, to a position preceding by one character on the list. That is, by means of selecting a reference list in the reference list memory 26, corresponding to a first character of a block-sorted character string, transposition sequentially responding may be better in dependence to data than the MTF transformation that sharply responds to a context change. Therefore, in that case, transposition may be performed by the transposing unit 56. The transposing unit 56 also has the reference list memory 26 similarly to the case of the MTF transformation. In the reference list memory 26, for example, 256 kinds of reference lists are registered beforehand in correspondence to each of 256 kinds of characters. Of course, as shown in FIG. 26, it may be good to store reference lists whose divided number is decided with the upper 4 bits or any proper bits of a first character code.

Figure 7:
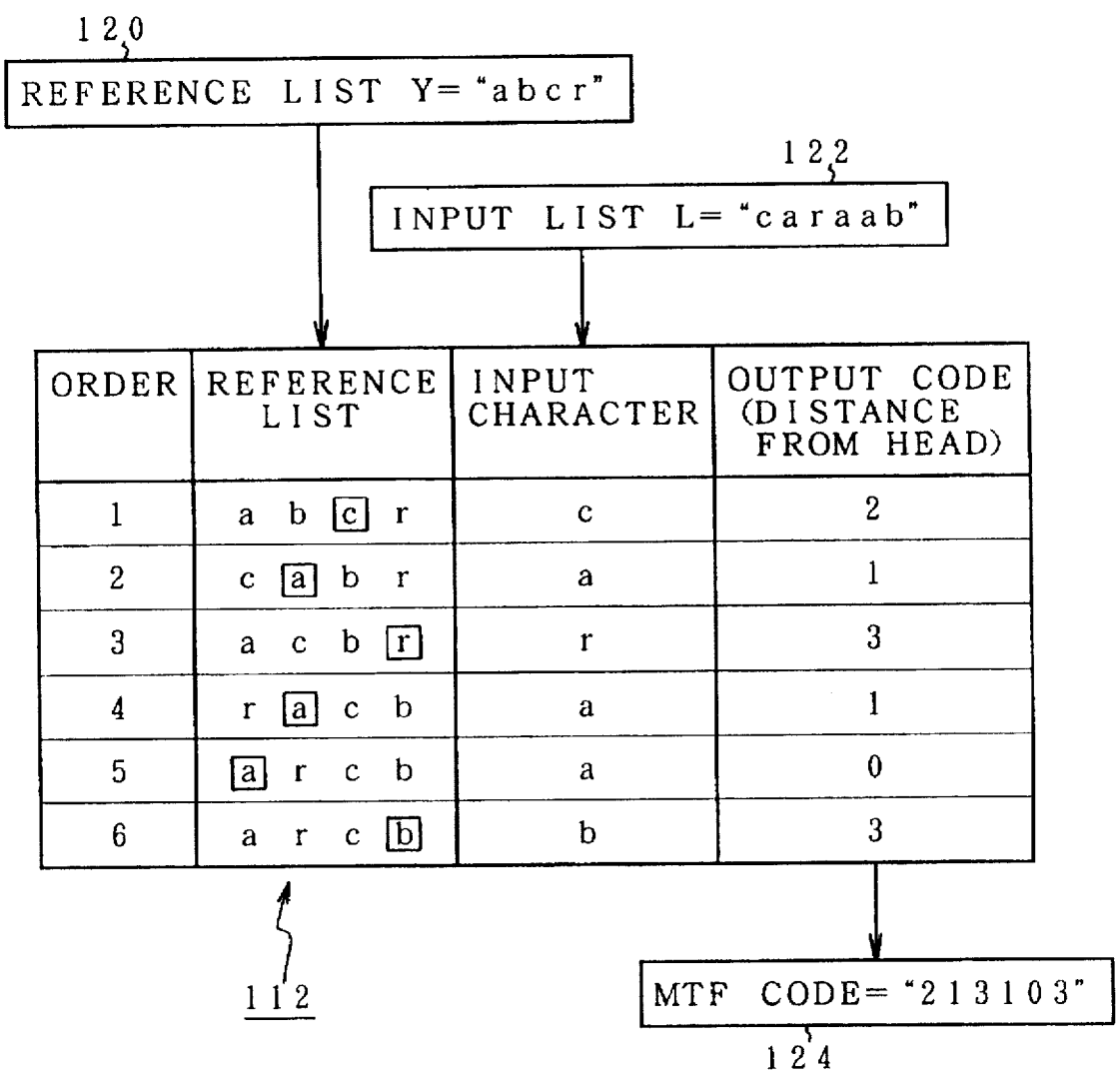
FIG. 7 is a functional block diagram of the MTF transformation shown in FIG. 1.
Figure 32:
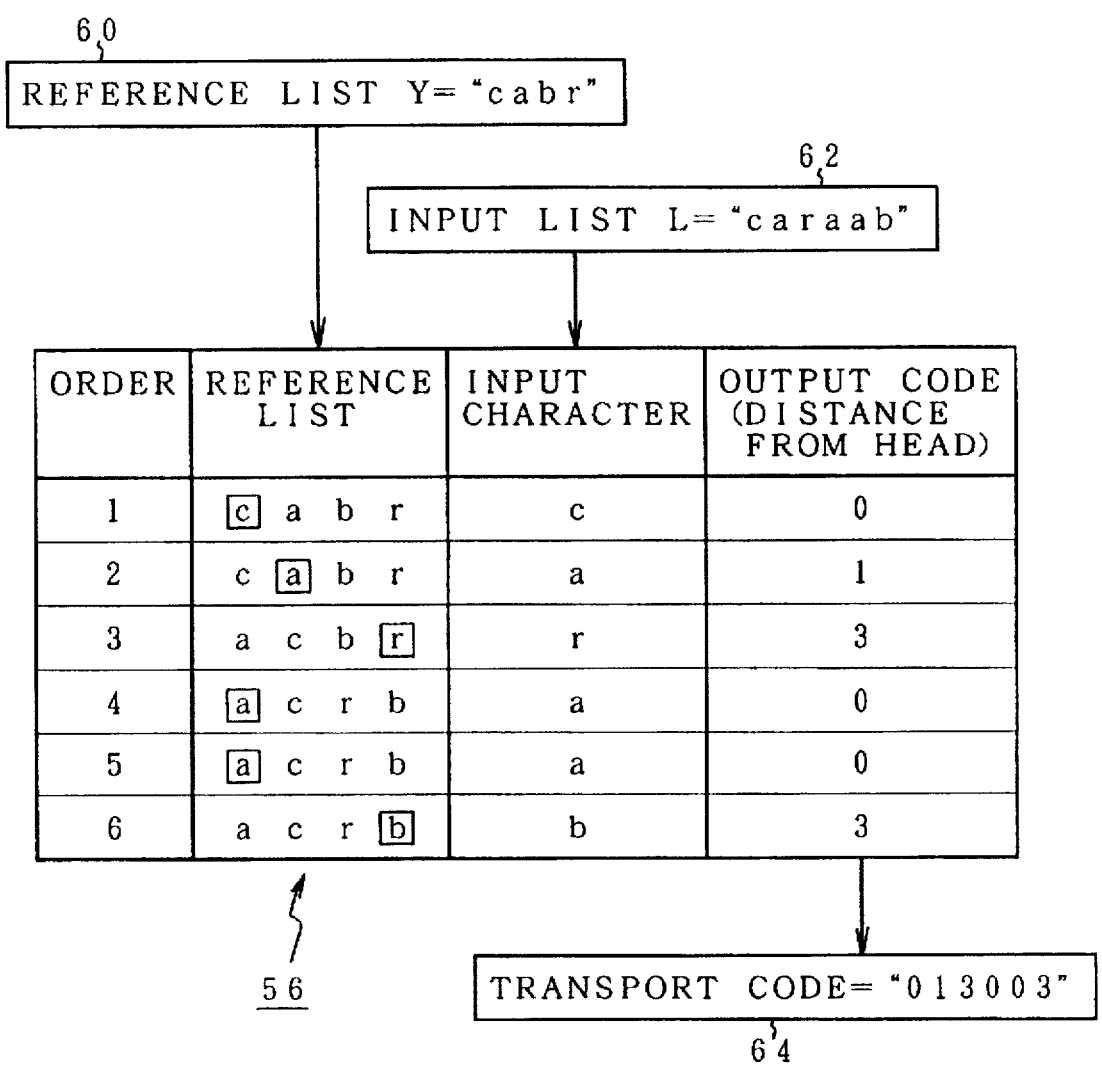
FIG. 32 is a functional block diagram of the transposing unit shown in FIG. 31.

FIG. 32 is a block diagram of a transposition by the transposing unit 56 shown in FIG. 31. For simple explanation, similarly to a conventional example shown in FIG. 7, an input list L, "caraab" is passed with block-sorting transformation to a register 62. In addition, a reference list Y(c), "cabr" is prepared in correspondence to the first character "c" of the input list L. The transposing unit 56 inputs the first character "c" of the input list L, and outputs "0", a position from the head on the reference list as an output code. Although the unit usually moves the character "c" on the reference list, used in the transformation, to a position preceding by one character, in this case, the list is not updated because the character is at the head. Regarding the second character "a", since it is at the first position on the reference list, it is transformed into an output code "1". Next, the character "a" on the list, used in the transformation, is moved to a position preceding by one character, and hence, the next reference list is updated to "acbr". By repeating the same processing as the above, a transposed code is set to the register 64 as a code string, "013003", which is passed to the next stage, entropy coding unit 14.

Figure 33:
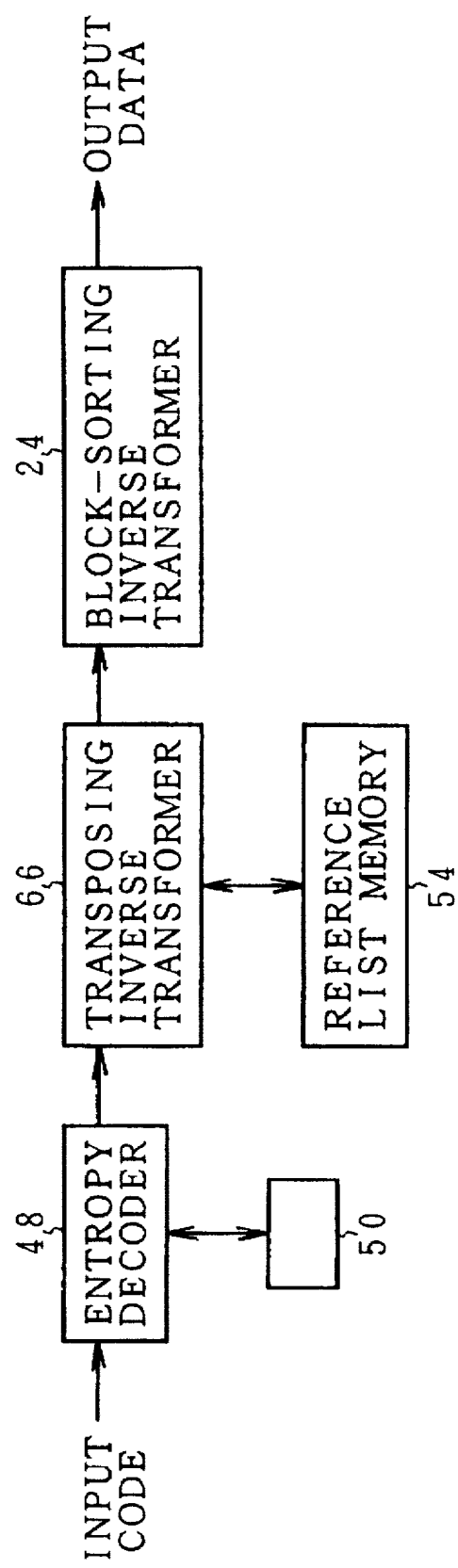
FIG. 33 is a block diagram of the apparatus for data decompression for decompressing into a character string a code string outputted from the apparatus for data compression, which is shown in FIG. 31.

FIG. 33 shows an apparatus for data decompression corresponding to the apparatus for data compression performing transposition in FIG. 31. The apparatus for data decompression comprises the entropy decoding unit 48 having the code table 50, an inverse transposing unit 66, and the block-sorting inverse transforming unit 24. The entropy decoding unit 48 is the same one as that in the MTF inverse transformation shown in FIG. 28. The inverse transposing unit 66 selects a corresponding reference list in a reference list memory 54 in the basis of identification information on a reference list, sent from the compression side. Then, the unit inversely transposes a transposed code string into a block-sorted character string.

Figure 34:
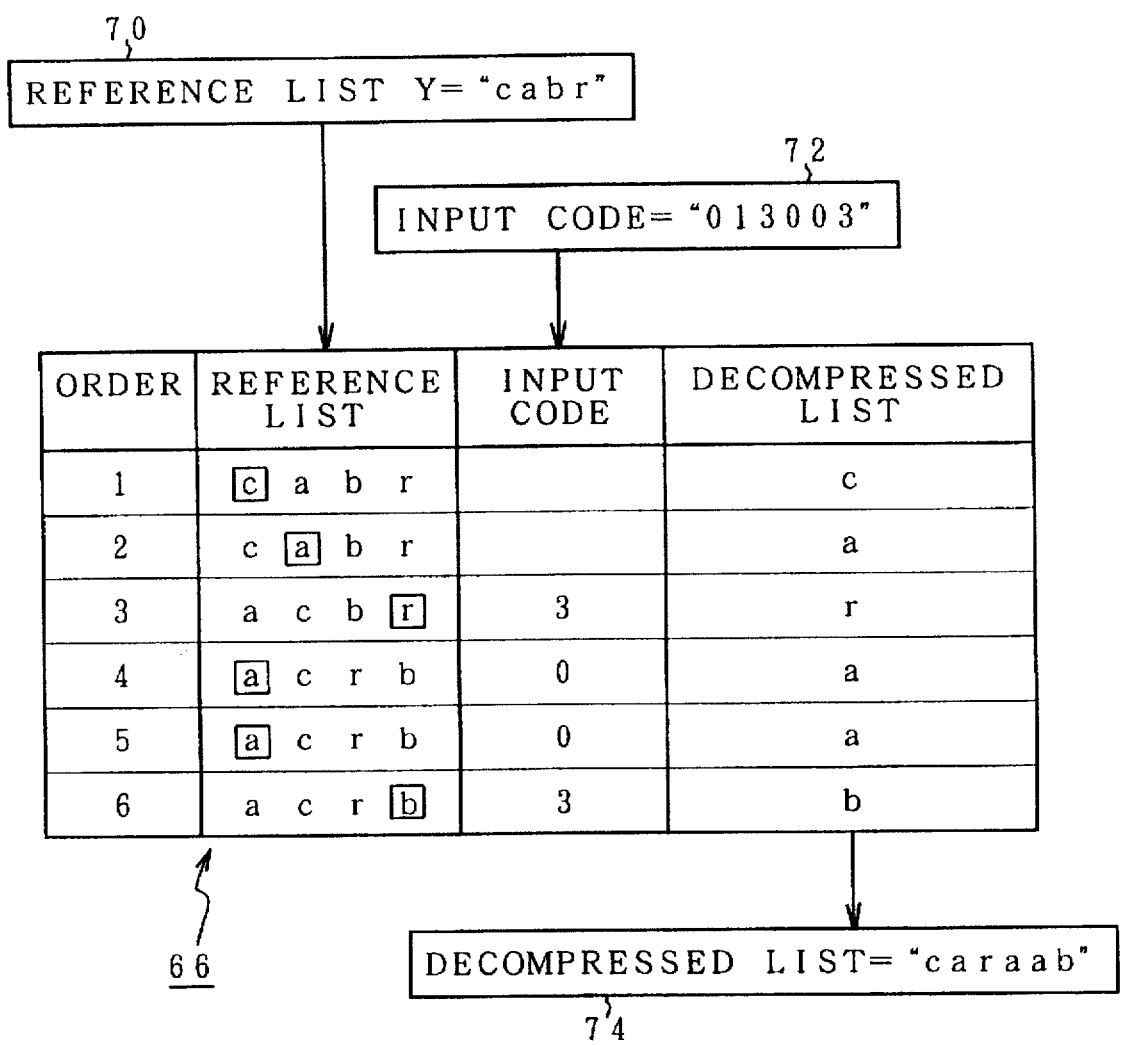
FIG. 34 is a functional block diagram of the inverse transposing unit shown in FIG. 33.

FIG. 34 is a functional block diagram of the inverse transposing unit 66 shown in FIG. 33. The code string "013003" transformed in FIG. 32 is set in the register 72 as an input code. In this case, by selecting a reference list according to reference list identification information from the compression side, the reference list Y, "cabr" is set in a register 70. The inverse transposing unit 66 inputs a first character "0" of the register 72, refers to the first character on the reference list, and decompresses it into a first character "c" on the list. After decompression, the unit usually moves the character used in the decompression to the head. However, in this case, the character is at the head, and hence, the list is not updated. Next, the unit inputs a code "1", and decompresses it into a character "a" that is located at the second position on the reference list. Similarly to the above, by repeating decompression of a code and disposition of the reference list, the unit can generate a decompressed list, "caraab" in the register 74 as a decompressed list.

As described above, by means of the present invention, it is possible with a block-sorting algorithm to suppress decrease of coding efficiency at a discontinuous part and to increase compression efficiency in a block-sorting algorithm by properly use code tables according to property of similar context at a discontinuous part when encoding a relevant part of context.

In addition, although a discontinuous part caused by the change of context is avoided by enlarging block size, the present invention can increase compression efficiency at the discontinuous part. Therefore, even if the block size is small, sufficient compression efficiency can be obtained with block-sorting.

Further, in data compression and decompression of the present invention, regarding the MTF transformation in an intermediate stage of a block-sorting algorithm, it is possible to suppress decrease of coding efficiency at a discontinuous part where context is changed, to suppress decrease of coding efficiency in the MTF transformation due to a discontinuous part without enlarging block size, and to increase data compression efficiency as a whole using a reference list that is selected according to property of a locally similar part of context.

In addition, a transposition can be performed by using reference lists according to property of context instead of the MTF transformation. Hence, depending on property of context, it is possible with the transposition to obtain the data compression efficiency higher than that with the MTF transformation.

Further, it is also possible to realize an apparatus for data compression and an apparatus for data decompression according to the present invention as a compression and decompression algorithm with software as well as hardware. Furthermore, if a code is composed of only characters, this can be also used for compression and decompression of proper data such as video data.

What is claimed is:

1. An apparatus for data compression comprising:
 a block-sorting transforming unit generating a new two-dimensional character matrix with rotating a character string in a block by a number of times equal to a number of characters in the block, the block which is obtained through dividing input data of a string into predetermined size of blocks, sorting rows in the matrix lexicographically, picking up last characters in the matrix in a sorted order, and outputting them as a block-sorted character string;

a move-to-front (hereinafter: MTF) transforming unit having a reference list including all of characters composing said block-sorted character string, transforming each character of said block-sorted character string from a first character in turn into a code showing a registered position on said reference list, subsequently transforming a next character after moving the transformed character to the head of the reference list, transforming said block-sorted character string into an intermediate code string showing registered positions on said reference list, and outputting the intermediate code; and an entropy coding unit having a plurality of code tables corresponding to a change of an input character string, and applying entropy coding to the intermediate code inputted from said MTF transforming unit with using the plurality of code table.

2. An apparatus for data compression according to claim 1, wherein said entropy coding unit has two kinds of switching timing for said plurality of code tables, a first switching timing when a discontinuous part is detected with a first character of the present block-sorted character string changing from one of the previous block-sorted character string, and a second switching timing when a number of processed blocks having the same first character reaches at the predetermined number after detection of said discontinuous part.

3. An apparatus for data compression according to claim 2, wherein said entropy coding unit has said plurality of code tables, a first code table where bit lengths assigned to high-usage characters and low-usage ones are greatly different, and a second code table where bit lengths assigned to high-usage characters and low-usage ones are not so different, and wherein, at said first timing when said discontinuous part is detected, said first code table is switched to said second code table, and, at said second timing when a number of processed blocks reaches at a predetermined number after detection of the discontinuous part, said second code table is switched to said first code table.

4. An apparatus for data compression according to claim 3, wherein, regarding n blocks having identical first characters of said block-sorted character strings, said entropy coding unit changes a number of blocks processed during switching to the second code table after detection of a discontinuous part and switching to the first code table, applies entropy coding, calculates a total amount of codes, and decides said number of switched blocks, at which a minimum total amount of codes is obtained, as an optimum value of the number of processed blocks with which said second switching timing is decided.

5. An apparatus for data compression according to claim 4, wherein said entropy coding unit decides said optimum value of the number of switched blocks, while the unit transforms an input string, and uses the value to switch code tables for subsequent blocks.

6. An apparatus for data compression according to claim 4, wherein said entropy coding unit decides said optimum value of the number of switched blocks beforehand, while the unit transforms an input string composed of typical data, and uses the value to switch code tables for all blocks.

7. An apparatus for data compression according to claim 3, wherein said entropy coding unit provides a plurality of said first code tables corresponding to combination of a plurality of characters starting with the head of said block-sorted character string, and, in case the unit switches the second code table to the first code table after detecting said discontinuous part, the unit selects a first code table corresponding to the combination of a plurality of characters starting with the head of a block-sorted character string.

8. In an apparatus for data decompression:

generating a new two-dimensional character matrix with rotating a character string in a block by a number of times equal to a number of characters in the block, the block which is obtained through dividing input data of a string into predetermined size of blocks, sorting rows in the matrix lexicographically, picking up last characters of the two-dimensional character matrix in a sorted order, and outputting them as a block-sorted character string;

having a reference list including all of characters composing said block-sorted character string, transforming each character of said block-sorted character string from a first character in turn into a code showing a registered position on said reference list, subsequently transforming a next character after moving the transformed character to the head of the reference list, transforming said block-sorted character string into an intermediate code string showing registered positions on said reference list, and outputting the intermediate code; and having a plurality of code tables corresponding to a change of an input character string, applying entropy coding to the intermediate code inputted from said MTF transforming unit, and decompressing said entropy-coded code string into an original character string, the apparatus for data decompression comprising:

an entropy decoding unit having a plurality of code tables corresponding to a change of an input string, inputting said entropy-coded code string and decoding the string into said intermediate code string;

an MTF inverse transforming unit restoring the intermediate code to said block-sorted character string using said reference list; and a block-sorting inverse transforming unit restoring to an original character string the block-sorted character string transformed by said MTF inverse transforming unit.

9. An apparatus for data compression according to claim 8, wherein said entropy decoding unit has two kinds of switching timing for code tables, a first switching timing when a discontinuous part is detected with a first character of a present block-sorted character string changing from one of a previous block-sorted character string, and a second switching timing when a number of processed blocks having the same first character reaches at a predetermined number after detection of said discontinuous part.

10. An apparatus for data decompression according to claim 9, wherein said entropy decoding unit has said plurality of code tables:

a first code table where bit lengths assigned to high-usage characters and low-usage ones are greatly different; and a second code table where bit lengths assigned to high-usage characters and low-usage ones are not so different, and wherein, at said first timing when said discontinuous part is detected, said first code table is switched to said second code table, and, at said second timing when a number of processed blocks reaches at a predetermined number after detection of the discontinuous part, said second code table is switched to said first code table.

11. An apparatus for data decompression according to claim 10, wherein, regarding n blocks having identical first characters of said block-sorted character strings, said entropy decoding unit changes a number of blocks processed during switching to the second code table after detection of a discontinuous part and switching to the first code table, applies entropy coding, calculates a total amount of codes, and decides said number of switched blocks, at which a minimum total amount of codes is obtained, as an optimum value of the number of processed blocks with which said second switching timing is decided.

12. An apparatus for data decompression according to claim 11, wherein said entropy decoding unit decides said optimum value of the number of switched blocks, while the unit transforms an input string, and uses the value to switch code tables for subsequent blocks.

13. An apparatus for data decompression according to claim 11, wherein said entropy decoding unit decides said optimum value of the number of switched blocks beforehand, while the unit transforms an input string composed of typical data, and uses the value to switch code tables for all blocks.

14. An apparatus for data decompression according to claim 10, wherein said entropy decoding unit provides a plurality of said first code tables corresponding to combination of a plurality of characters starting with the head of said block-sorted character string, and, in case the unit switches the second code table to the first code table after detecting said discontinuous part, the unit selects a first code table corresponding to the combination of a plurality of characters starting with the head of a block-sorted character string.

15. An apparatus for data compression comprising:
a block-sorting transforming unit generating a new two-dimensional character matrix with rotating a character string in a block by a number of times equal to a number of characters in the block, the block which is obtained through dividing input data of a string into predetermined size of blocks, sorting rows in the matrix lexicographically, picking up last characters in the matrix in a sorted order, and outputting them as a block-sorted character string;
a reference list memory storing a plurality of reference lists including characters composing said block-sorted character string;
an intermediate code transforming unit selecting one of said plurality of reference lists, transforming each character of said block-sorted character string from a first character in turn into a code showing a registered position on said reference list, subsequently transforming a next character after moving the transformed character to the preceding position of the reference list, transforming said block-sorted character string into an intermediate code string showing registered positions on said reference list, and outputting the intermediate code; and
an entropy coding unit having a plurality of code tables corresponding to a change of an input character string, and applying entropy coding to identification information on the used reference list and the intermediate code inputted from said intermediate code transforming unit.

16. An apparatus for data compression according to claim 15, wherein said intermediate code transforming unit selects a reference list in said reference list memory in correspondence to a character or a plurality of characters starting with the head of said block-sorted character string.

17. An apparatus for data compression according to claim 15, wherein said intermediate code transforming unit moves a character transformed into a code showing a registered position on said reference list to the head on the list, and transforms a next character.

18. An apparatus for data compression according to claim 15, wherein said intermediate code transforming unit moves a character transformed into a code showing a registered position on said reference list to a position preceding by one character on the list, and transforms a next character.

19. An apparatus for data compression according to claim 15, wherein said intermediate code transforming unit continuously uses for subsequent blocks a reference list selected and updated in a transformation of a first block.

20. In an apparatus for data decompression:
generating a new two-dimensional character matrix through rotating a character string in a block by a number of times equal to a number of characters in the block, the block which is obtained through dividing input data of a string into predetermined size of blocks, sorting rows in the matrix lexicographically, picking up last characters of the two-dimensional character matrix in a sorted order, and outputting them as a block-sorted character string;
having a plurality of reference lists including all of characters composing said block-sorted character string, selecting one of them, transforming each character of said block-sorted character string from a first character in turn into a code showing a registered position on said reference list, subsequently transforming a next character after moving the transformed character to a preceding position of the reference list, transforming said block-sorted character string into an intermediate code string showing registered positions on said reference list; and
having a code table corresponding to a change of an input character string, inputting said intermediate code string and identification information on the reference list used for the transformation, applying entropy coding to them and decompressing the entropy-coded code string into the original character string, the apparatus for data decompression comprising:
an entropy decoding unit having a code table corresponding to a change of an input string, inputting said entropy-coded code string and decoding the string into said intermediate code string and identification information on the reference list;
a reference list memory storing a plurality of reference lists including all characters composing said block-sorted character string;
an MTF inverse transforming unit restoring the intermediate code to said block-sorted character string with selecting a reference list specified by said identification information from said reference list memory; and
a block-sorting inverse transforming unit restoring to the original character string the block-sorted character string transformed by said MTF inverse transforming unit.

21. An apparatus for data decompression according to claim 20, wherein said intermediate code inverse transforming unit selects a reference list in said reference list memory in correspondence to a character or a plurality of characters starting with the head of said block-sorted character string.

22. An apparatus for data decompression according to claim 20, wherein said intermediate code inverse transforming unit moves a character transformed into a code showing a registered position on said reference list to the head on the list, and transforms a next character.

23. An apparatus for data decompression according to claim 20, wherein said intermediate code inverse transforming unit moves a character transformed into a code showing a registered position on said reference list to a position preceding by one character on the list, and transforms a next character.

24. An apparatus for data decompression according to claim 20, wherein said intermediate code inverse transforming unit continuously uses for subsequent blocks a reference list selected and updated in a transformation of a first block.

* * * * *